US012796430B2

(12) United States Patent
Kim et al.

(10) Patent No.: US 12,796,430 B2
(45) Date of Patent: Nov. 10, 2026

(54) SEMICONDUCTOR DEVICES INCLUDING BACKSIDE AND VERTICAL POWER STRUCTURES

(71) Applicant: SAMSUNG ELECTRONICS CO., LTD., Suwon-si (KR)

(72) Inventors: Yeonggil Kim, Suwon-si (KR); Hoonseok Seo, Suwon-si (KR); Minchul Ahn, Suwon-si (KR); Wookyung You, Suwon-si (KR); Woojin Lee, Suwon-si (KR); Junghwan Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 455 days.

(21) Appl. No.: 18/486,853

(22) Filed: Oct. 13, 2023

(65) Prior Publication Data

US 2024/0258204 A1 Aug. 1, 2024

(30) Foreign Application Priority Data

Jan. 27, 2023 (KR) ........................ 10-2023-0010824

(51) Int. Cl.
*H10W 20/20* (2026.01)
*H10D 30/43* (2025.01)
(Continued)

(52) U.S. Cl.
CPC ............ *H10W 20/20* (2026.01); *H10D 30/43* (2025.01); *H10D 30/6729* (2025.01);
(Continued)

(58) Field of Classification Search
CPC ............... H10D 30/43; H10D 30/6729; H10D 30/6735; H10D 30/6757; H10D 30/62;
(Continued)

(56) References Cited

U.S. PATENT DOCUMENTS

| | | | |
|---|---|---|---|
| 10,529,618 | B2 | 1/2020 | Lu et al. |
| 10,985,057 | B2 | 4/2021 | Jourdain et al. |

(Continued)

FOREIGN PATENT DOCUMENTS

| | | | | | |
|---|---|---|---|---|---|
| CN | 102280478 | A | * | 12/2011 | ........ H10W 20/0245 |
| CN | 113206062 | A | * | 8/2021 | ........ H10W 20/0696 |
| KR | 20130036591 | A | | 4/2013 | |

*Primary Examiner* — Ida M Soward
(74) *Attorney, Agent, or Firm* — Wolf, Greenfield & Sacks, P.C.

(57) ABSTRACT

A semiconductor device including: a substrate including an active region extending in a first direction; a gate structure extending in a second direction on the active region; source/drain regions on the active region and adjacent the gate structure; a backside insulating layer on a lower surface of the substrate; a vertical power structure between adjacent source/drain regions, wherein the vertical power structure extends through the substrate and the backside insulating layer and has an exposed lower surface exposed; an interlayer insulating layer on the backside insulating layer; a backside power structure that extends through the interlayer insulating layer and is connected to the vertical power structure; and a first alignment insulating layer between the backside insulating layer and the interlayer insulating layer, wherein the first alignment insulating layer has a first opening exposing the lower surface of the vertical power structure and contacts the backside power structure.

20 Claims, 31 Drawing Sheets

(51) Int. Cl.
*H10D 30/67* (2025.01)
*H10D 62/10* (2025.01)

(52) U.S. Cl.
CPC ..... *H10D 30/6735* (2025.01); *H10D 30/6757* (2025.01); *H10D 62/121* (2025.01)

(58) Field of Classification Search
CPC .. H10D 62/121; H10D 64/254; H10D 64/256; H10D 84/834
See application file for complete search history.

(56) References Cited

U.S. PATENT DOCUMENTS

| | | | | |
|---|---|---|---|---|
| 11,037,872 | B2 | 6/2021 | Han et al. | |
| 11,069,613 | B2 | 7/2021 | Lee et al. | |
| 11,177,286 | B2 | 11/2021 | Kim et al. | |
| 11,532,556 | B2 * | 12/2022 | Huang | H10D 30/024 |
| 2013/0082399 | A1 | 4/2013 | Kim et al. | |
| 2020/0328116 | A1 * | 10/2020 | Zhu | H10W 20/023 |
| 2020/0381300 | A1 * | 12/2020 | Zhang | H10D 30/6728 |
| 2021/0035965 | A1 * | 2/2021 | Mizutani | H10B 41/27 |
| 2021/0358848 | A1 | 11/2021 | Wu et al. | |
| 2021/0375986 | A1 * | 12/2021 | Dutta | H10N 50/80 |
| 2021/0407999 | A1 * | 12/2021 | Huang | B82Y 10/00 |
| 2022/0122970 | A1 * | 4/2022 | Do | H10D 84/834 |
| 2022/0157956 | A1 * | 5/2022 | Chen | H10D 30/6219 |
| 2023/0343838 | A1 * | 10/2023 | Chang | H10D 30/6735 |

* cited by examiner

SEMICONDUCTOR DEVICES INCLUDING BACKSIDE AND VERTICAL POWER STRUCTURES

CROSS-REFERENCE TO RELATED APPLICATION(S)

This application claims benefit of priority to Korean Patent Application No. 10-2023-0010824 filed on Jan. 27, 2023 in the Korean Intellectual Property Office, the disclosure of which is incorporated herein by reference in its entirety.

BACKGROUND

The present inventive concept relates to semiconductor devices.

As demands for high performance, high speed, and/or multifunctionality of semiconductor devices increase, degrees of integration of the semiconductor devices are increasing. According to the trend for high degrees of integration of semiconductor devices, semiconductor devices having a back side power delivery network (BSPDN) structure in which a power rail is disposed on a backside of a wafer are being developed. In addition, in order to overcome the limitations of operating characteristics due to a decrease in size of a planar metal oxide semiconductor FET (MOSFET), efforts are being made to develop semiconductor devices including FinFETs having a three-dimensional structure channel.

SUMMARY

An aspect of the present inventive concept is to provide semiconductor devices having improved reliability.

According to an aspect of the present inventive concept, a semiconductor device comprising: a substrate including an active region that extends in a first direction; a gate structure extending in a second direction on the active region, wherein the second direction intersects the first direction; source/drain regions on the active region, wherein the source/drain regions are adjacent the gate structure; a backside insulating layer on a lower surface of the substrate; a vertical power structure between adjacent source/drain regions among the source/drain regions in the second direction, wherein the vertical power structure extends through the substrate and the backside insulating layer and has a lower surface exposed from the backside insulating layer; an interlayer insulating layer on a lower surface of the backside insulating layer; a backside power structure that extends through the interlayer insulating layer and is connected to the vertical power structure; and a first alignment insulating layer between the lower surface of the backside insulating layer and the interlayer insulating layer, wherein the first alignment insulating layer has a first opening exposing the lower surface of the vertical power structure, and wherein the first alignment insulating layer is in contact with the backside power structure.

According to an aspect of the present inventive concept, a semiconductor device comprising: a substrate including an active region that extends in a first direction; a gate structure extending on the substrate in a second direction, wherein the second direction intersects the first direction; source/drain regions on the active region, wherein the source/drain regions are adjacent the gate structure; a vertical power structure extending through the substrate in a third direction that is perpendicular to an upper surface of the substrate, wherein the vertical power structure is electrically connected to at least a portion of the source/drain regions; a backside insulating layer on a lower surface of the substrate, wherein the backside insulating layer is in a periphery of the vertical power structure; an alignment insulating layer on a lower surface of the backside insulating layer, wherein the alignment insulating layer has an opening that exposes a lower surface of the vertical power structure; and a backside power structure that fills the opening and is connected to the vertical power structure, wherein the alignment insulating layer has a first thickness in a first region adjacent to the vertical power structure and a second thickness in a second region, wherein the second thickness is thicker than the first thickness, and wherein the second region is farther than the first region from the vertical power structure.

According to an aspect of the present inventive concept, A semiconductor device comprising: a substrate including an active region that extends in a first direction; a gate structure extending on the substrate in a second direction, wherein the second direction intersects the first direction; source/drain regions on the active region, wherein the source/drain regions are adjacent the gate structure; a vertical power structure extending through the substrate in a third direction that is perpendicular to an upper surface of the substrate, wherein the vertical power structure is electrically connected to at least a portion of the source/drain regions; an alignment insulating layer on a lower surface of the substrate, wherein the alignment insulating layer has an opening that exposes a lower surface of the vertical power structure; and a backside power structure that fills the opening of the alignment insulating layer and is connected to the vertical power structure, wherein an upper surface of the vertical power structure is located on a level in the third direction, equal to or higher than levels of upper surfaces of the source/drain regions in the third direction relative to the substrate, and wherein a level of the lower surface of the vertical power structure in the third direction is lower than a level of the lower surface of the substrate in the third direction relative to the substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
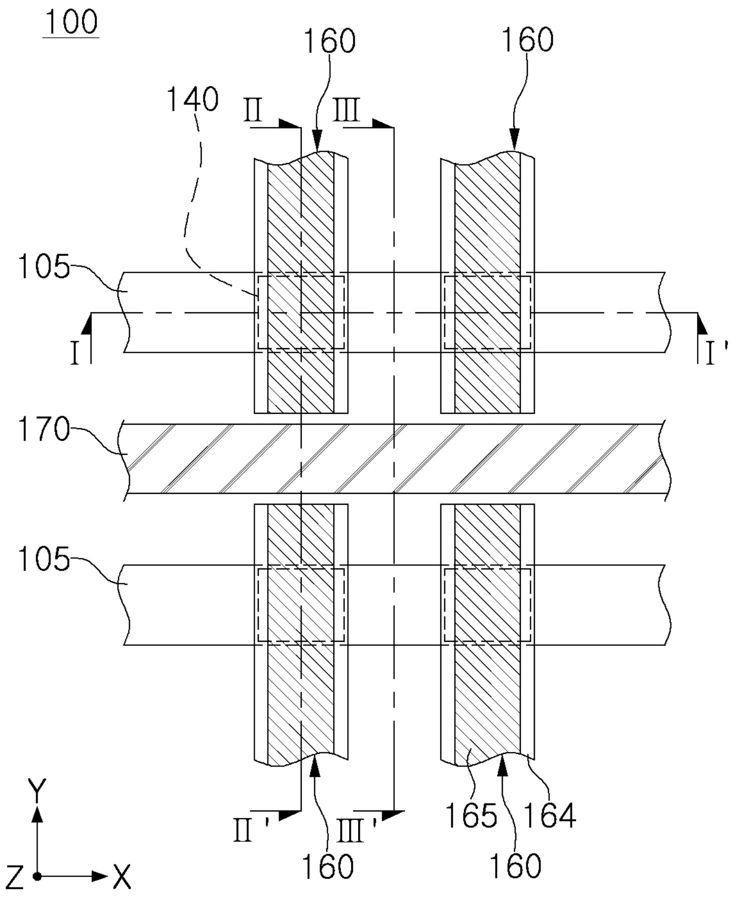
FIG. 1 is a plan view illustrating a semiconductor device according to example embodiments.

Hereinafter, embodiments of the present inventive concept will be described with reference to the accompanying drawings. Hereinafter, it can be understood that terms such as 'on,' 'upper portion,' 'upper surface,' 'below,' 'lower portion,' 'lower surface,' 'side surface,' and the like may be indicated by reference numerals and may be based on drawings, unless otherwise indicated.

FIG. 1 is a plan view illustrating a semiconductor device according to example embodiments.

Figure 2A:
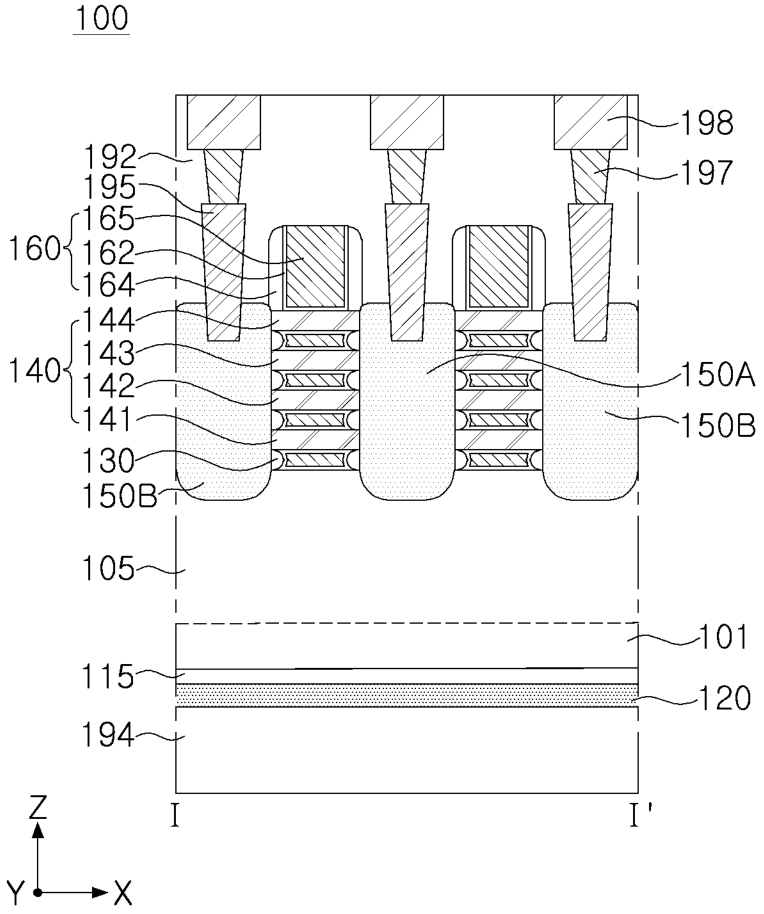
FIGS. 2A, 2B, and 2C are cross-sectional views illustrating a semiconductor device according to example embodiments.
Figure 2B:
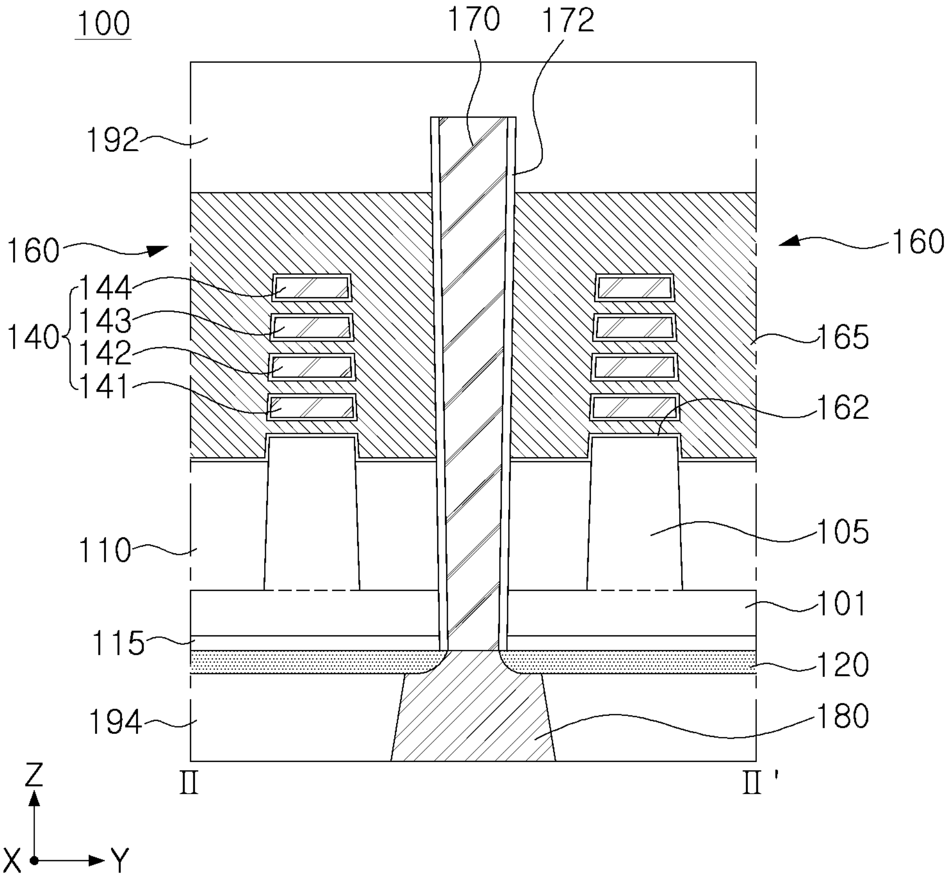
Figure 2C:
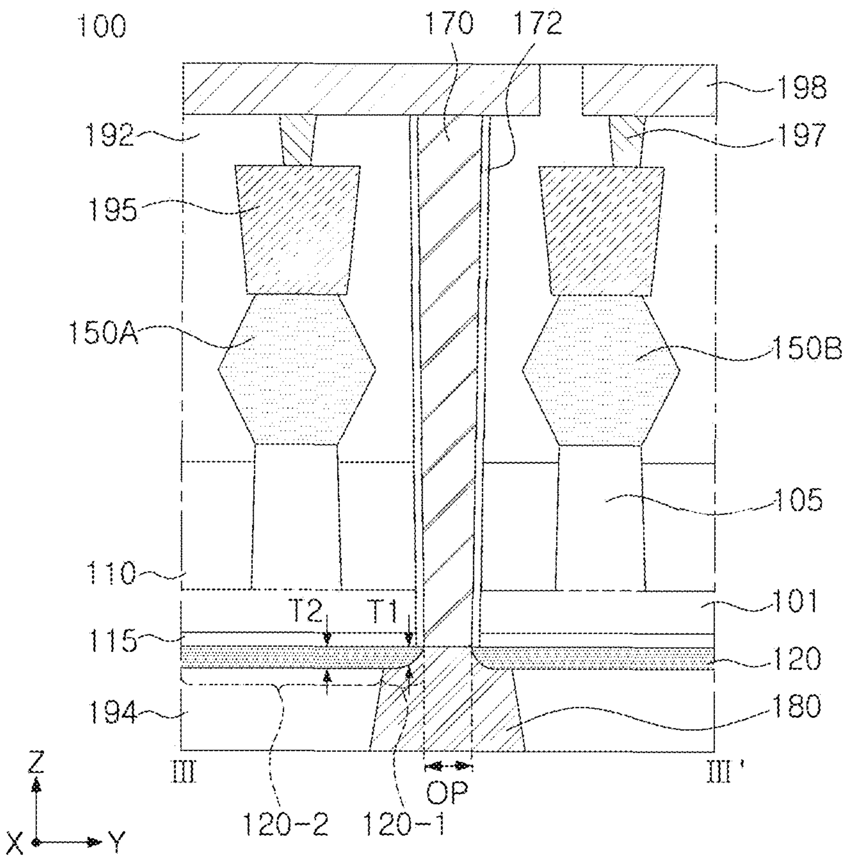

FIGS. 2A, 2B, and 2C are cross-sectional views illustrating a semiconductor device according to example embodiments. FIGS. 2A, 2B, and 2C illustrate cross-sections of the semiconductor device of FIG. 1, taken along lines I-I', II-II', and III-III', respectively. For convenience of explanation, only some components of the semiconductor device are illustrated in FIG. 1.

Referring to FIGS. 1, 2A, 2B, and 2C, a semiconductor device 100 may include a substrate 101 including active regions 105, channel structures 140 including first to fourth channel layers 141, 142, 143, and 144 disposed on the active regions 105 and vertically spaced apart from each other, gate structures 160 extending to cross the active regions 105 and respectively including gate electrodes 165, first and second source/drain regions 150A and 150B adjacent (e.g., contacting) the channel structures 140, a backside insulating layer 115 disposed on a lower surface of the substrate 101, a vertical power structure 170 electrically connected to the first source/drain region 150A, a backside power structure 180 electrically connected (e.g., connected) to the vertical power structure 170, and an alignment insulating layer 120 disposed on a lower surface of the backside insulating layer 115 and exposing a lower surface of the vertical power structure 170. It will be understood that when an element A is referred to as exposing another element B, while the element A may be on the element B, the element A may not entirely cover the element B and at least a portion of the element B may not be covered by the element A. For example, the backside insulating layer 115 may be disposed in a periphery of the vertical power structure 170. The semiconductor device 100 may further include contact plugs 195 respectively and electrically connected (e.g., connected) to the first and second source/drain regions 150A and 150B, upper vias 197 on the contact plugs 195, and upper interconnection lines 198 on the upper vias 197. The semiconductor device 100 may further include a device isolation layer 110, internal spacer layers 130, a vertical insulating layer 172, and first and second interlayer insulating layers 192 and 194. Each of the gate structures 160 may include gate dielectric layers 162, gate spacer layers 164, and a gate electrode 165.

It will be understood that when an element or layer is referred to as crossing or intersecting another element or layer, the elements or layers may respectively extend at the same vertical level or different vertical levels in different directions that intersect each other. It will be understood that when an element or layer is referred to as being "connected to", or "coupled to" another element or layer, it may be directly on, connected to, or coupled to the other element or layer, or one or more intervening elements or layers may be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. For example, an "electrical connection" between element A and element B may include a direct physical connection between element A and element B and/or an indirect physical connection between element A and element B with one or more intervening elements therebetween. Spatially relative terms, such as "beneath," "below," "lower," "under," "above," "upper," and the like, may be used herein for ease of explanation to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

The substrate 101 may have an upper surface extending in a first direction (e.g., X-direction) and a second direction (e.g., Y-direction). For example, the first direction and the second direction may be parallel with the upper surface of the substrate 101. The first direction and the second direction may intersect each other. The substrate 101 may include a semiconductor material, such as a group IV semiconductor, a group III-V compound semiconductor, or a group II-VI compound semiconductor, but is not limited thereto. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The substrate 101 may include active regions 105 disposed. The active regions 105 may be disposed in an upper portion of the substrate 101. However, depending on a description method, the active regions 105 may also be described as a separate component from the substrate 101. In some embodiments, a lower portion of the substrate 101 below the active regions 105 may be removed.

The active regions 105 may be arranged to extend in the first direction, for example, the X-direction. The active regions 105 may be defined by a predetermined depth from an upper surface in a portion of the substrate 101. The active regions 105 may be formed as a portion of the substrate 101, or may include an epitaxial layer grown from the substrate 101. Each of the active regions 105 may include active fins protruding in an upward direction. The active regions 105, together with the channel structures 140, may form an active structure in which a channel region of a transistor is formed. Each of the active regions 105 may include an impurity region. The impurity region may form at least a portion of a well region of the transistor.

The device isolation layer 110 may be located between adjacent active regions 105 in the second direction, for example, the Y-direction. Upper surfaces of the active regions 105 may be located on a level, higher than upper surface of the device isolation layer 110. The active regions 105 may be partially recessed on both sides of the gate structures 160, and the first and second source/drain regions 150A and 150B may be respectively disposed on the recessed regions. The first and second source/drain regions 150A and 150B may be adjacent the gate structures 160.

The device isolation layer 110 may fill between the active regions 105 and may define the active regions 105 on (or in an upper portion of) the substrate 101. The device isolation layer 110 may be formed by, for example, a shallow trench isolation (STI) process. The device isolation layer 110 may expose an upper surface of the active region 105 or partially expose an upper portion (e.g., an upper surface and at least a portion of a side surface) of the active region 105. The device isolation layer 110 may be formed of an insulating material. The device isolation layer 110 may include, for example, an oxide, a nitride, or a combination thereof.

The backside insulating layer 115 may be disposed on (e.g., to cover) the lower surface of the substrate 101. If the upper surface of the substrate 101 on which the active regions 105 may be disposed is referred to as a first surface, the backside insulating layer 115 may be disposed on a second surface of the substrate 101, opposite to the first surface. The backside insulating layer 115 may provide a surface for growing the alignment insulating layer 120 when the semiconductor device 100 is manufactured. Therefore, the backside insulating layer 115 may entirely overlap the alignment insulating layer 120 in a third direction (e.g., Z-direction). It will be understood that when an element A is referred to as entirely overlapping an element B, at least a surface of the element A may be entirely covered by the element B. The third direction may be perpendicular to the upper surface of the substrate 101 and may be referred to as a vertical direction. For example, a lower surface of the backside insulating layer 115 may be entirely covered by an upper surface of the alignment insulating layer 120.

A vertical level (e.g., in the third direction) of the lower surface of the backside insulating layer 115 may be substantially the same as a vertical level (e.g., in the third direction) of a lower surface of the vertical power structure 170. The thickness of the backside insulating layer 115 in the third direction may be variously changed in embodiments. The backside insulating layer 115 may include an insulating material such as an oxide, a nitride, or a combination thereof, but is not limited thereto. In some embodiments, the backside insulating layer 115 may include, for example, a native oxide layer of the substrate 101. The native oxide layer of the substrate 101 may refer to an oxide layer formed by natural oxidation of the substrate 101 without an artificial process.

The gate structures 160 may be disposed on the active regions 105 to cross the active regions 105 and extend in the second direction, e.g., the Y-direction. Channel regions of transistors may be formed in the active regions 105, crossing the gate electrodes 165 of the gate structures 160, and the channel structure 140. Some of the gate structures 160 may be spaced apart from each other while being disposed on a straight line in the second direction, e.g., Y-direction.

Each of the gate structures 160 may include the gate dielectric layers 162, the gate spacer layers 164, and the gate electrode 165. In example embodiments, each of the gate structures 160 may further include a capping layer on an upper surface of the gate electrode 165. In some embodiments, a portion of the first interlayer insulating layer 192 on the gate structures 160 may be referred to as a gate capping layer.

The gate dielectric layers 162 may be disposed between the active region 105 and the gate electrode 165 and between the channel structure 140 and the gate electrode 165. The gate dielectric layers 162 may be arranged to cover at least a portion of surfaces of the gate electrode 165. For example, the gate dielectric layers 162 may be disposed to surround all surfaces except for an uppermost surface of the gate electrode 165. The gate dielectric layers 162 may extend between the gate electrode 165 and the gate spacer layers 164, but are not limited thereto. The gate dielectric layer 162 may include, for example, an oxide, a nitride, or a high-x material, but is not limited thereto. The high-x material may mean a dielectric material having a higher dielectric constant than silicon oxide ($SiO_2$). The high-x material may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$), but is not limited thereto. According to example embodiments, the gate dielectric layer 162 may be provided as a multilayer structure.

The gate electrode 165 may include a conductive material. In some embodiments, the gate electrode 165 may include, for example, a metal nitride such as titanium nitride (TiN), tantalum nitride (TaN), or tungsten nitride (WN). In some embodiments, the gate electrode 165 may include, for example, a metal material such as aluminum (Al) or tungsten. (W), or molybdenum (Mo). In some embodiments, the gate electrode 165 may include, for example, a semiconductor material such as doped polysilicon. According to embodiments, the gate electrode 165 may be provided as a multilayer structure.

The gate spacer layers 164 may be disposed on both side surfaces of the gate electrode 165 on the channel structure 140. The gate spacer layers 164 may space apart (e.g., insulate) the first and second source/drain regions 150A and 150B from the gate electrodes 165. Depending on embodiments, shapes of upper ends of the gate spacer layers 164 may be variously changed, and the gate spacer layers 164 may be provided as a multilayer structure. The gate spacer layers 164 may include, for example, of an oxide, a nitride, and/or an oxynitride, but are not limited thereto. The gate spacer layers 164 may include, for example, a low-x film.

The channel structures 140 may be disposed on the active regions 105 in regions in which the active regions 105 intersect the gate structures 160. Each of the channel structures 140 may include the first to fourth channel layers 141, 142, 143, and 144 that may be two or more channel layers spaced apart from each other in the third direction (e.g., the Z-direction). The channel structures 140 may be electrically connected (e.g., connected) to the first and second source/drain regions 150A and 150B. Each of the channel structures 140 may have a width, equal to or narrower than a width of the active region 105 in the second direction (e.g., Y-direction) and may have a width equal to or similar to a width of each of the gate structures 160 in the first direction (e.g., X-direction). In a cross-section in the second direction (e.g., Y-direction), a lower channel layer may have a width, equal to or wider than a width of an upper channel layer, among the first to fourth channel layers 141, 142, 143, and 144. In some embodiments, in a cross-section in the first direction (e.g., X-direction), the channel structures 140 may have a decrease in width, as compared to the gate structures 160, such that side surfaces thereof are located below the gate structures 160.

The channel structures 140 may include a semiconductor material, for example, silicon (Si), silicon germanium (SiGe), or germanium (Ge), but is not limited thereto. The channel structures 140 may include the same material as the active regions 105. The number and shapes of channel layers constituting one channel structure 140 may be variously changed in embodiments. For example, the first to fourth channel layers 141, 142, 143, and 144 may have more than two channel layers but are not limited to four channel layers.

In the semiconductor device 100, the gate electrode 165 may be disposed between the active region 105 and the channel structures 140, between each of the first to fourth channel layers 141, 142, 143, and 144 of the channel structures 140, and on the channel structures 140. In some embodiments, the semiconductor device 100 may include a multi-bridge-channel FET (MBCFET™) transistor, which may be a gate-all-around type field effect transistor. In some embodiments, the semiconductor device 100 may not include the multi-bridge-channel FET (MBCFET™), and may include, for example, a FinFET structure.

The first and second source/drain regions 150A and 150B may be disposed on both sides of the gate structures 160 to contact the channel structures 140, respectively. The first and second source/drain regions 150A and 150B may be disposed in regions in which an upper portion of the active region 105 is partially recessed. The first source/drain region 150A may refer to a source/drain region electrically connected to the vertical power structure 170, and the second source/drain region 150B may refer to a different source/drain region from the first source/drain region 150A. As illustrated in FIG. 2C, the first source/drain region 150A may be electrically connected to the backside power structure 180 through the contact plug 195, the upper via 197, the upper interconnection line 198, and the vertical power structure 170, to receive power.

Upper surfaces of the first and second source/drain regions 150A and 150B may be located at the same or similar vertical level as lower surfaces of the gate structures 160 on the channel structures 140, but the vertical levels of the upper surfaces of the first and second source/drain regions 150A and 150B may be variously changed in embodiments. The first and second source/drain regions 150A and 150B may have a polygonal shape as illustrated in FIG. 2C, an elliptical shape, or the like, in a cross-section in the second direction (e.g., Y-direction), but is not limited to the illustrated shape. The first and second source/drain regions 150A and 150B may include a semiconductor material, for example, silicon (Si) and/or germanium (Ge) and may further include impurities. However, the embodiments of the material of the first and second source/drain regions 150A and 150B are not limited thereto.

The internal spacer layers 130 may be disposed parallel to at least a portion of the gate electrode 165 between the first to fourth channel layers 141, 142, 143, and 144 in the third direction (e.g., Z-direction). For example, a portion of the internal spacer layer 130 may be at the same vertical level as at least a portion of the gate electrode 165. The gate electrode 165 may be spaced apart and/or electrically separated from the first and second source/drain regions 150A and 150B by the internal spacer layers 130. The internal spacer layers 130 may have a shape in which a side surface facing the gate electrode 165 may be convexly rounded toward the gate electrode 165, but are not limited thereto. The internal spacer layers 130 may include, for example, an oxide, a nitride, and/or an oxynitride, but are not limited thereto. The internal spacer layers 130 may include, for example, low-x films. In some embodiments, the internal spacer layers 130 may be omitted.

The contact plugs 195 may be disposed on the first and second source/drain regions 150A and 150B. The contact plugs 195 may extend through (e.g., pass through) the first interlayer insulating layer 192, and may be electrically connected (e.g., connected) to the first and second source/drain regions 150A and 150B. The contact plugs 195 may have side surfaces inclined to decrease widths of the contact plugs 195 toward the substrate 101 due to an aspect ratio, but are not limited thereto. The contact plugs 195 may partially recess the first and second source/drain regions 150A and 150B and may be arranged to partially contact surfaces of the first and second source/drain regions 150A and 150B including upper surfaces of the first and second source/drain regions 150A and 150B. Separate gate contact plugs may be further disposed on the gate electrodes 165 in a region not illustrated.

Each of the contact plugs 195 may include a metal silicide layer located on a lower end thereof, and may further include a barrier layer disposed on the metal silicide layer and sidewalls. The barrier layer may include, for example, a metal nitride such as titanium nitride (TiN), tantalum nitride (TaN), or tungsten nitride (WN), but is not limited thereto. The contact plugs 195 may include, for example, a metal material such as aluminum (Al), tungsten (W), molybdenum (Mo), or the like. In example embodiments, the number and arrangement of conductive layers constituting the contact plugs 195 may be variously changed.

The vertical power structure 170 may be disposed to electrically connect (e.g., connect) the upper interconnection line 198 and the backside power structure 180. As illustrated in FIG. 2C, the vertical power structure 170 may be disposed between the first source/drain region 150A and the second source/drain region 150B, adjacent in the second direction (e.g., Y-direction). The vertical power structure 170 may be disposed to extend through (e.g., pass through) the first interlayer insulating layer 192, the device isolation layer 110, the substrate 101, and the backside insulating layer 115.

As illustrated in FIG. 1, the vertical power structure 170 may be disposed in a region in which the gate structures 160 are spaced apart from each other in the second direction (e.g., Y-direction) and/or in a region overlapping the above-noted region in the first direction (e.g., X-direction). The vertical power structure 170 may be spaced apart from the gate structures 160 in the second direction (e.g., Y-direction). Therefore, the vertical power structure 170 may not overlap the gate structures 160 in the first direction (e.g., X-direction). The vertical power structure 170 may extend in the first direction (e.g., X-direction) to have a linear shape, but a length to be extended is not limited to that illustrated in FIG. 1. In some embodiments, the vertical power structure 170 may have an elliptical shape or a circular shape in a plan view. In some embodiments, the vertical power structure 170 may not extend between gate structures 160 adjacent to each other in the second direction (e.g., Y-direction).

In this embodiment, the vertical power structure 170 may be connected to the upper interconnection line 198 through an upper surface of the vertical power structure 170 and may be connected to the backside power structure 180 through a lower surface of the vertical power structure 170. The upper surface or an upper end of the vertical power structure 170 may be located on a vertical level, higher than vertical levels of upper surfaces or upper ends of the first and second source/drain regions 150A and 150B. The lower surface of the vertical power structure 170 may be located on a vertical level, lower than vertical levels of lower surfaces of the first and second source/drain regions 150A and 150B, may be located on a vertical level, lower than vertical levels of the upper and lower surfaces of the active regions 105, and may be located on a vertical level, lower than a vertical level of the lower surface of the substrate 101. The vertical power structure 170 may have side surfaces inclined to decrease widths of the vertical power structure 170 toward the substrate 101 due to an aspect ratio, but are not limited thereto.

The vertical power structure 170 may include a conductive material, for example, a metal material such as molybdenum (Mo), aluminum (Al), tungsten (W), or the like. In some embodiments, the vertical power structure 170 may further include a barrier layer disposed on sidewalls. The barrier layer may include, for example, a metal nitride such as titanium nitride (TiN), tantalum nitride (TaN), or tungsten nitride (WN), but is not limited thereto.

The vertical insulating layer 172 may be disposed on (e.g., cover) side surfaces of the vertical power structure 170. The vertical insulating layer 172 may electrically separate (e.g., insulate) the vertical power structure 170 from the substrate 101. In some embodiments, the vertical insulating layer 172 may be disposed only in a region between the vertical power structure 170 and the substrate 101. The vertical insulating layer 172 may include an insulating material. The vertical insulating layer 172 may include, for example, an oxide, a nitride, and/or an oxynitride, but is not limited thereto.

The alignment insulating layer 120 may be disposed on (e.g., cover) the lower surface of the backside insulating layer 115. The alignment insulating layer 120 may be disposed on a vertical level, lower than the vertical power structure 170, and may be disposed on (e.g., cover) a lower surface of the vertical insulating layer 172. The alignment insulating layer 120 may be a layer that allows the backside power structure 180 to self-align to the vertical power structure 170 during a formation process of the backside power structure 180.

The alignment insulating layer 120 may be a dielectric-on-dielectric layer formed by selectively depositing on a dielectric. Therefore, the alignment insulating layer 120 may entirely overlap the backside insulating layer 115 and the vertical insulating layer 172, which may be a dielectric material, in the third direction (e.g., Z-direction). The alignment insulating layer 120 may not be formed on the lower surface of the vertical power structure 170 and may have an opening OP exposing the lower surface of the vertical power structure 170. An opening of an element A may refer to a region of the element A exposing another element, such as an element B, from other regions of the element A. The opening of the element A may or may not be filled with a third element, such as element C. The alignment insulating layer 120 may extend around (e.g., surround) a side surface of an upper region of the backside power structure 180 that fills the opening OP. The alignment insulating layer 120 may be in contact with the backside power structure 180 adjacent (e.g., around) the opening OP. For example, the alignment insulating layer 120 may be in contact with the side surface of the upper region of the backside power structure 180 in the opening OP. It will be understood that when element A is referred to as "filling" element B, element A may partially or entirely fill element B. A side surface of the alignment insulating layer 120 defining the opening OP, and a lower surface of the alignment insulating layer 120 adjacent to the side surface may be covered with the backside power structure 180 (e.g., the upper region of the backside power structure 180).

The alignment insulating layer 120 may have an uneven lower surface, and may have a relatively small thickness in the third direction (e.g., Z-direction) in a region adjacent to the vertical power structure 170 and the opening OP. For example, the alignment insulating layer 120 may have a first thickness T1 in a first region 120-1 adjacent to the vertical power structure 170, and may have a second thickness T2, greater than the first thickness T1 in a second region 120-2 spaced apart from the vertical power structure 170. For example, the second region 120-2 may be farther than the first region 120-1 from the vertical power structure 170. The second thickness T2 may range from about 1 nanometer (nm) to about 10 nm, for example. The alignment insulating layer 120 may have a profile (e.g., a profile that is curved) according to a change in thickness in a region adjacent to the opening OP. The specific shape, inclination, or the like of a side surface defining the opening OP in the alignment insulating layer 120 may be variously changed in the embodiments.

The alignment insulating layer 120 may include a dielectric material. The alignment insulating layer 120 may include a material, different from a material of the second interlayer insulating layer 194. The alignment insulating layer 120 may include a material, different from a material of the backside insulating layer 115. The alignment insulating layer 120 may include, for example, $Al_2O_3$, HfO, $SiO_2$, and/or SiCOH, but is not limited thereto.

The backside power structure 180 may be connected to the lower end or lower surface of the vertical power structure 170. The backside power structure 180 may form a BSPDN that applies power or ground voltage and may also be referred to as a backside power rail or a buried power rail. For example, the backside power structure 180 may be a buried interconnection line extending below the vertical power structure 170 in one direction, for example, in the first direction (e.g., X-direction), but a shape of the backside power structure 180 is not limited thereto. For example, in some embodiments, the backside power structure 180 may include a via region and a line region.

The side surface of the upper region of the backside power structure 180 may be on (e.g., covered with) the alignment insulating layer 120, and side surfaces of a lower region of the backside power structure 180 may be on (e.g., covered with) the second interlayer insulating layer 194. The upper region of the backside power structure 180 may extend into the opening OP of the alignment insulating layer 120 to fill the opening OP. The backside power structure 180 may be on (e.g., may cover) the side and lower surfaces of the alignment insulating layer 120. The backside power structure 180 may be disposed, at least partially, along a profile of the alignment insulating layer 120. For example, the side surface of the upper region of the backside power structure 180 may have a profile (e.g., a profile that is curved) along the alignment insulating layer 120 (e.g., the opening OP of the alignment insulating layer 120). The backside power structure 180 may have a first width (in the first direction and/or second direction) within the opening OP of the alignment insulating layer 120 and may have a second width (in the same direction as the first width), wider than the first width, below the opening OP. The width of the backside power structure 180 (in the same direction as the first and the second widths) may continuously increase in a downward direction, but is not limited thereto.

The backside power structure 180 may include a conductive material, such as tungsten (W), copper (Cu), aluminum (Al), cobalt (Co), ruthenium (Ru), titanium (Ti), and/or molybdenum (Mo), but is not limited thereto.

The backside power structure 180 may be self-aligned to the vertical power structure 170 by the alignment insulating layer 120. In some embodiments, in the second direction (e.g., Y-direction), a center of the backside power structure 180 and a center of the vertical power structure 170 may not coincide. Even when the backside power structure 180 is misaligned and shifted with respect to the vertical power structure 170 as described above, since a position of the opening OP may not be changed, the backside power structure 180 may be connected to the vertical power structure 170.

The first interlayer insulating layer 192 may be disposed on (e.g., to cover) the upper surfaces of the first and second source/drain regions 150A and 150B and the upper surfaces of the gate structures 160 and may be disposed on (e.g., to cover) an upper surface of the device isolation layer 110. The second interlayer insulating layer 194 may be disposed on (e.g., to cover) the lower surface of the alignment insulating layer 120 and may extend around (e.g., surround) at least a side surface of the backside power structure 180.

The first and second interlayer insulating layers 192 and 194 may include, for example, an oxide, a nitride, and/or an oxynitride, but are not limited thereto. The first and second interlayer insulating layers 192 and 194 may include, for example, a low-x material. According to example embodiments, each of the first and second interlayer insulating layers 192 and 194 may include a plurality of insulating layers.

The semiconductor device 100 may be packaged by inverting the structure of FIGS. 2A, 2B, and 2C such that the backside power structure 180 is located in an upper portion of the semiconductor device 100, but a packaging form of the semiconductor device 100 is not limited thereto. Since the semiconductor device 100 may include the backside power structure 180 disposed below the first and second source/drain regions 150A and 150B, a degree of integration may be improved. In addition, since the backside power structure 180 may be aligned with the vertical power structure 170 by the alignment insulating layer 120, reliability may be secured, and a width of the vertical power structure 170 and a width of the backside power structure 180 may be minimized, to further improve a degree of integration of the semiconductor device 100.

In the description of the following embodiments, descriptions overlapping those described above with reference to FIGS. 1, 2A, 2B, and 2C will be omitted.

Figure 3A:
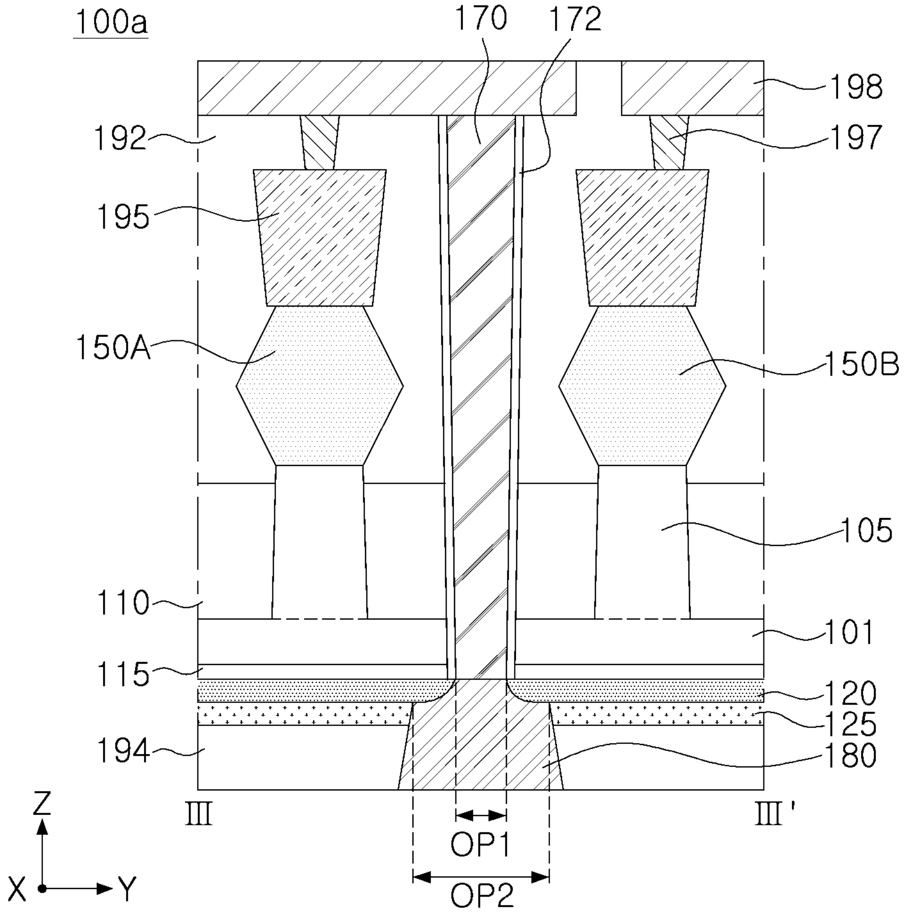
FIGS. 3A and 3B are schematic cross-sectional views illustrating a semiconductor device according to example embodiments.
Figure 3B:
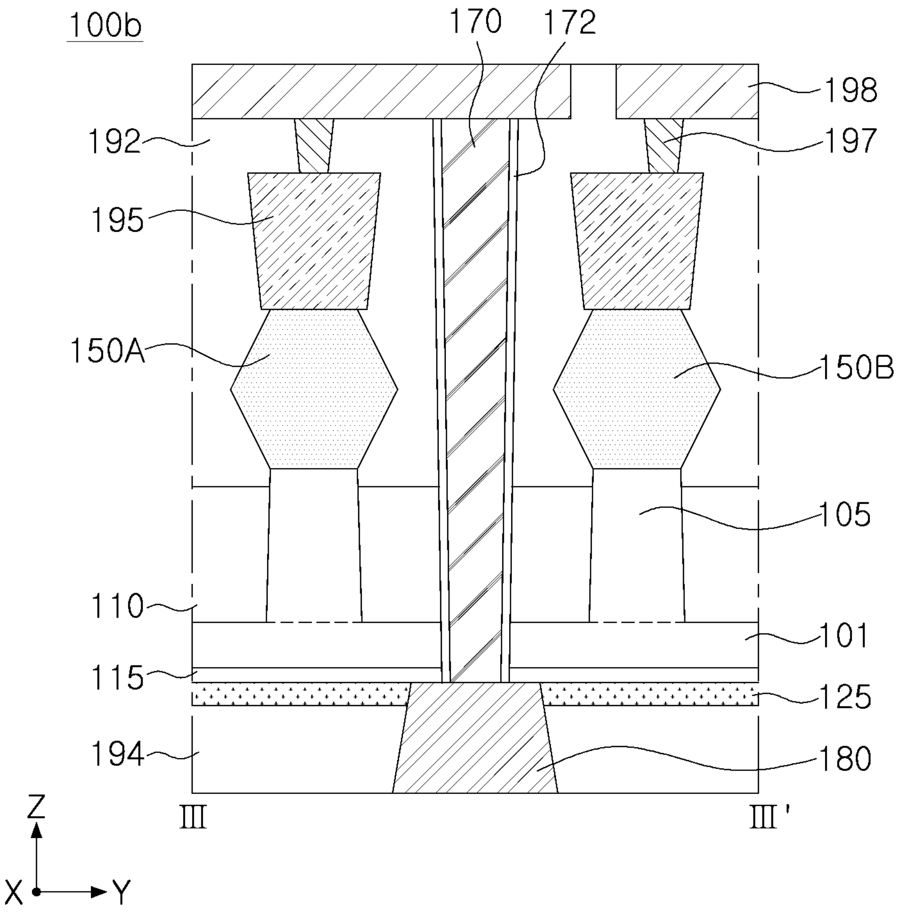

FIGS. 3A and 3B are schematic cross-sectional views illustrating a semiconductor device according to example embodiments. FIGS. 3A and 3B illustrate regions corresponding to FIG. 2C.

Referring to FIG. 3A, a semiconductor device **100*a* may further include an etch stop layer 125 disposed on a lower surface of an alignment insulating layer 120**.

The etch stop layer 125 may perform an etch stop function during a formation process of a backside power structure 180. The etch stop layer 125 may cover a portion of a lower surface of the alignment insulating layer 120 and a portion of a side surface of the backside power structure 180. The etch stop layer 125 may be in contact with the alignment insulating layer 120 and the backside power structure 180.

The alignment insulating layer 120 may have a first opening OP1 exposing a lower surface of the vertical power structure 170 and having a first width (in the first direction and/or second direction), and the etch stop layer 125 may have a second opening OP2 overlapping the first opening OP1 in the third direction (e.g., Z-direction) and a second width (in the same direction as the first width of the first opening OP1), wider than the first width of the first opening OP1. The second opening OP2 may expose the first opening OP1 and a portion of the alignment insulating layer 120. The first and second openings OP1 and OP2 may be filled with the backside power structure 180. A shape of an end portion of the etch stop layer 125 defining the second opening OP2 may be different from a shape of an end portion of the alignment insulating layer 120 defining the first opening OP1. The etch stop layer 125 may be penetrated by the backside power structure 180, and the end portion of the etch stop layer 125 may have a shape extending from a side surface of the backside power structure 180. The backside power structure 180 may be disposed, at least partially, along a profile of the alignment insulating layer 120 and the etch stop layer 125.

The etch stop layer 125 may include an insulating material. The etch stop layer 125 may include a material, different from a material of the alignment insulating layer 120. For example, the etch stop layer 125 may include a nitride and/or a metal element. The etch stop layer 125 may include, for example, SiN, SiCN, $Al_2O_3$, AlN, and/or HfO, but is not limited thereto.

Since the semiconductor device **100*a* may include the etch stop layer 125, alignment accuracy between the backside power structure 180 and a vertical power structure 170** may be further improved.

Referring to FIG. 3B, a semiconductor device **100*b* may not include an alignment insulating layer 120 (see FIG. 2C), and may further include an etch stop layer 125**.

The etch stop layer 125 may be disposed on a lower surface of a backside insulating layer 115 and may extend around (e.g., surround) a portion of a side surface of a backside power structure 180. The etch stop layer 125 may be in contact with the backside insulating layer 115 and the backside power structure 180. In some embodiments, the backside insulating layer 115 may be omitted, in which case the etch stop layer 125 may be disposed on a lower surface of a substrate 101. Otherwise, the description described above with reference to FIG. 3A may be equally applied to the etch stop layer 125.

Figure 4A:
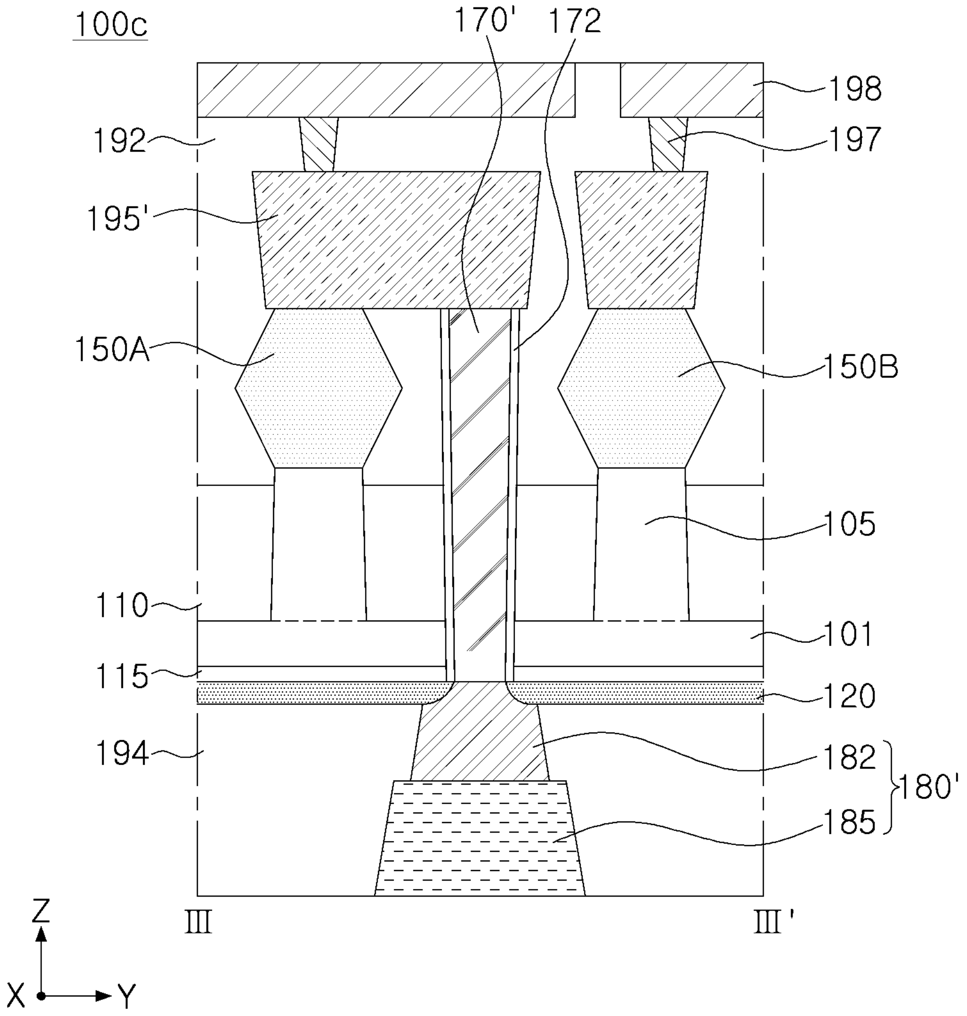
FIGS. 4A, 4B, and 4C are schematic cross-sectional views illustrating a semiconductor device according to example embodiments.
Figure 4B:
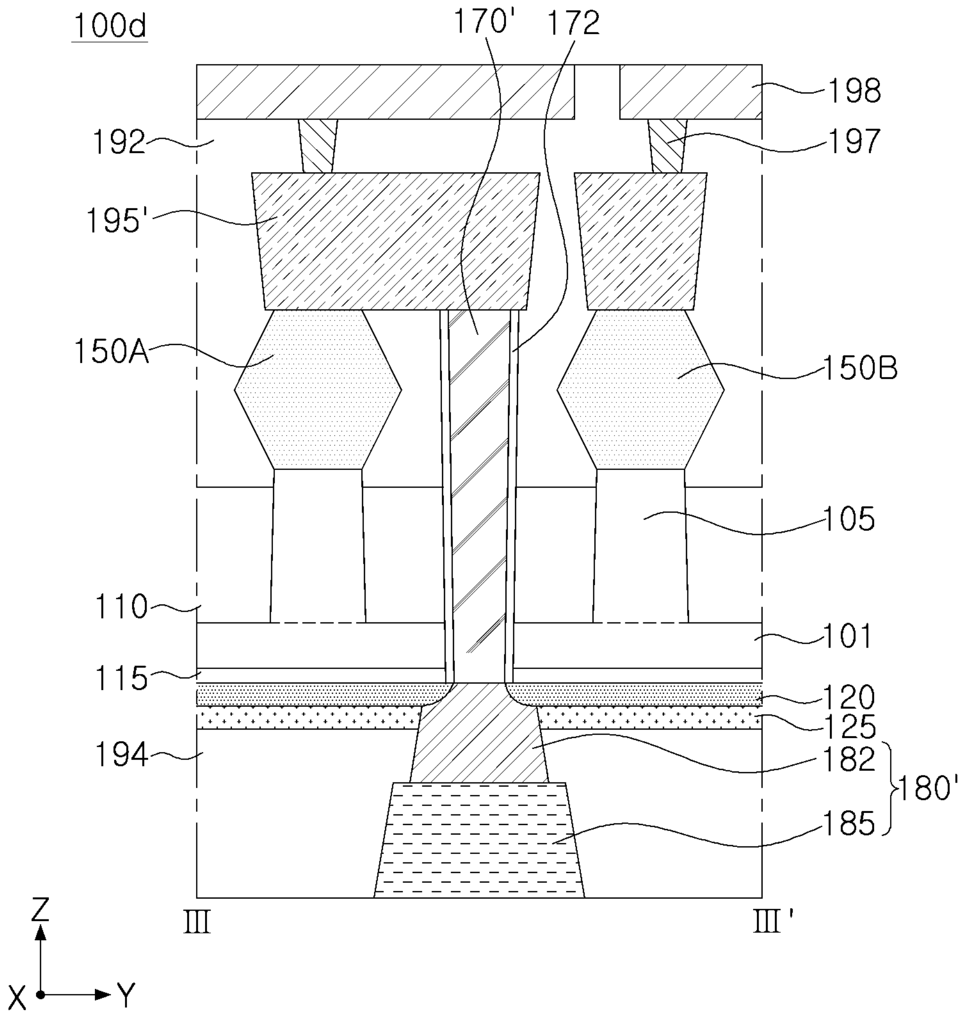
Figure 4C:
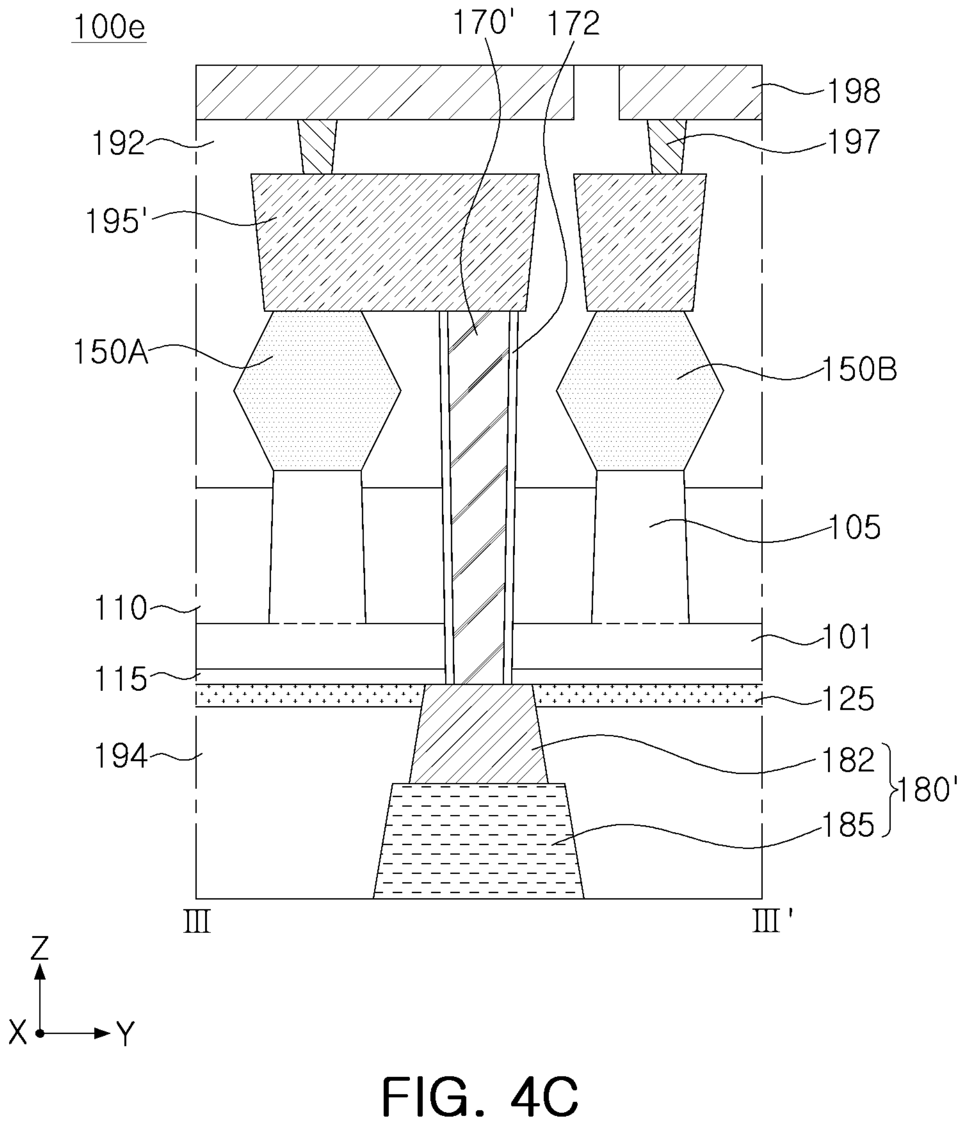

FIGS. 4A, 4B, and 4C are schematic cross-sectional views illustrating a semiconductor device according to example embodiments. FIGS. 4A, 4B, and 4C illustrate regions corresponding to FIG. 2C.

Referring to FIG. 4A, a semiconductor device **100*c* may be different from the embodiment of FIG. 2C, in terms of an arrangement of contact plugs 195', a vertical power structure 170', and a backside power structure 180'**.

Among the contact plugs 195', a contact plug 195' connected to a first source/drain region 150A may extend relatively longer (e.g., longer than the contact plug 195 in FIG. 2C) in the second direction (e.g., Y-direction) and may be connected to the vertical power structure 170'. The contact plug 195' may be connected to an upper surface of the vertical power structure 170', but is not limited thereto. In some embodiments, the contact plug 195' may be connected to a side surface of the vertical power structure 170', or may be connected to an upper surface and the side surface of the vertical power structure 170'. In some embodiments, the contact plug 195' and the vertical power structure 170' may be integrally formed. The upper surface or an upper end of the vertical power structure 170' may be located on the same vertical level as upper surfaces or upper ends of the first and second source/drain regions 150A and 150B. A lower surface of the vertical power structure 170' may be located on a vertical level, lower than a vertical level of a lower surface of a substrate 101.

The backside power structure 180' may include a power distribution line 182 and a metal structure 185, sequentially stacked from the vertical power structure 170'. The power distribution line 182 may be connected to a lower end or a lower surface of the vertical power structure 170'. Therefore, the alignment insulating layer 120 may also be in contact with the power distribution line 182. The metal structure 185 may be disposed on a lower surface of the power distribution line 182 and may be connected to the power distribution line 182. The power distribution line 182 and the metal structure 185 may form a BSPDN, and each may have the form of a line or a via, but are not limited thereto. Each of the power distribution line 182 and the metal structure 185 may have side surfaces inclined to decrease widths (e.g., in the first direction and/or second direction) in the upward direction. Otherwise, the description of the backside power structure 180 described above with reference to FIGS. 1, 2A, 2B, and 2C may be applied.

Referring to FIG. 4B, unlike the embodiment of FIG. 4A, a semiconductor device 100*d* may further include an etch stop layer 125 disposed on a lower surface of an alignment insulating layer 120. The description described above with reference to FIG. 3A may be equally applied to the etch stop layer 125.

Referring to FIG. 4C, unlike the embodiment of FIG. 4A, a semiconductor device 100*e* may not include an alignment insulating layer 120 (see FIG. 4A), and may further include an etch stop layer 125. The description described above with reference to FIGS. 3A and 3B may be equally applied to the etch stop layer 125.

Figure 5A:
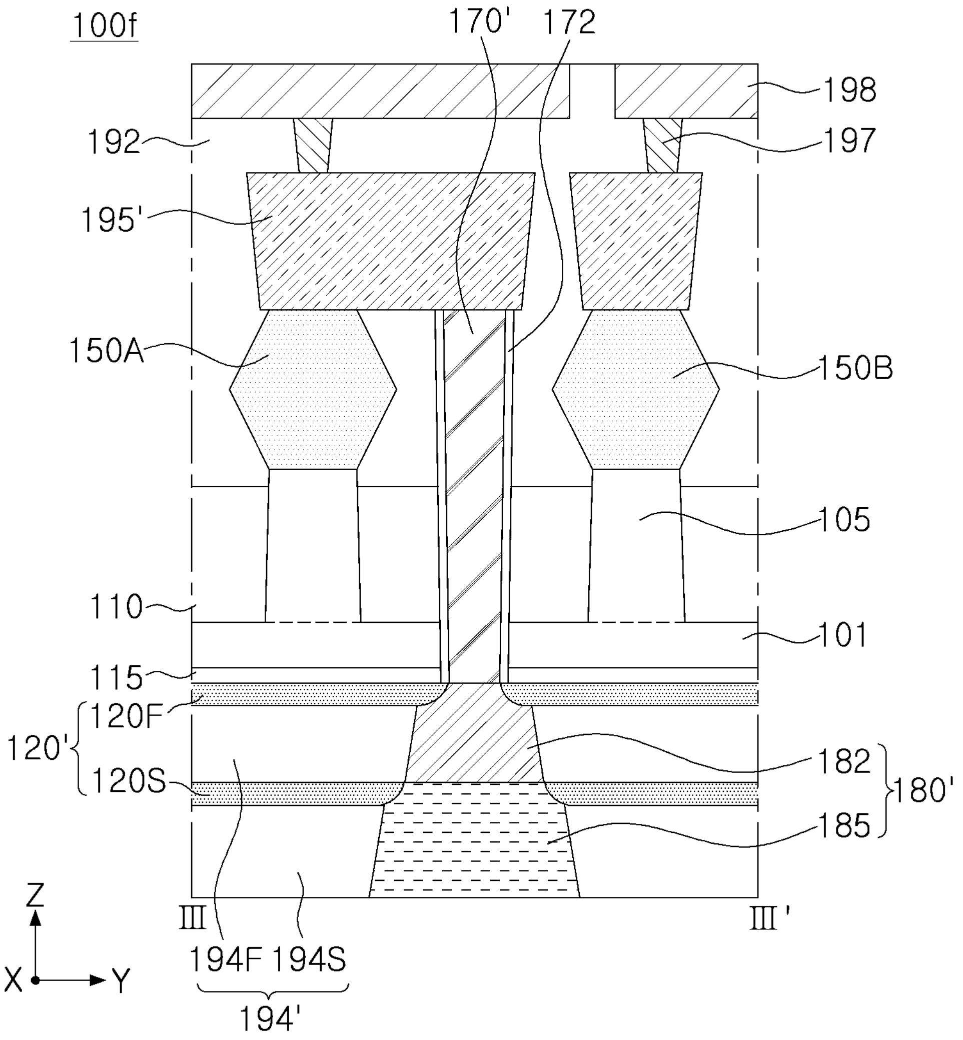
FIGS. 5A, 5B, and 5C are schematic cross-sectional views illustrating a semiconductor device according to example embodiments.
Figure 5B:
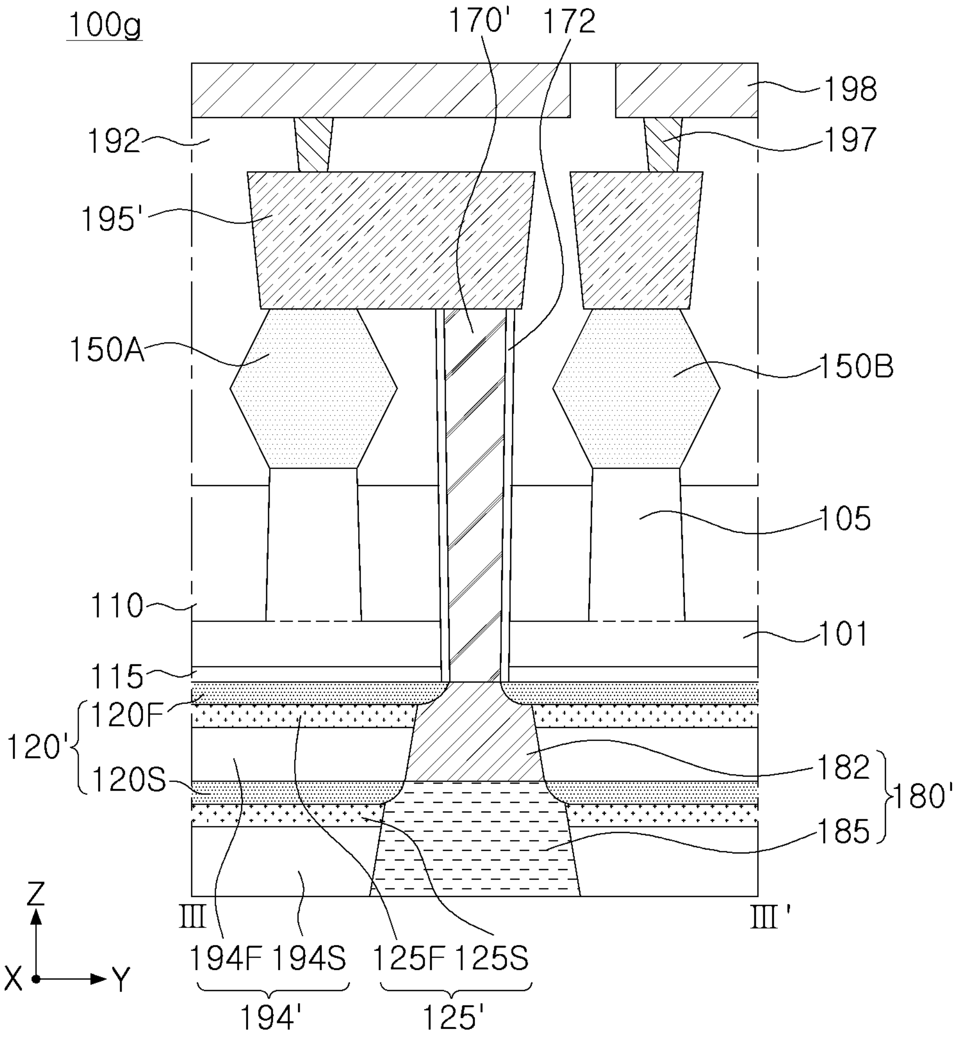
Figure 5C:
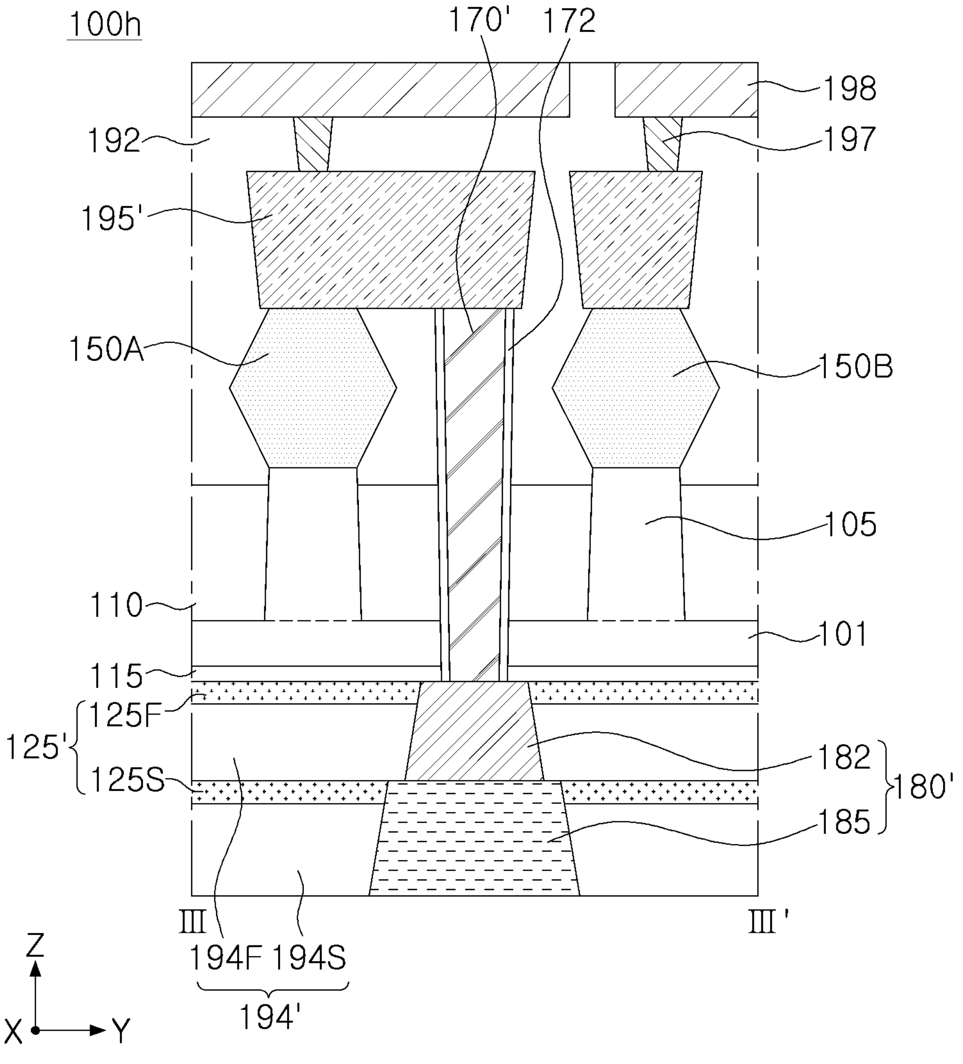

FIGS. 5A, 5B, and 5C are schematic cross-sectional views illustrating a semiconductor device according to example embodiments. FIGS. 5A, 5B, and 5C illustrate regions corresponding to FIG. 2C.

Referring to FIG. 5A, in a semiconductor device 100*f*, a second interlayer insulating layer 194' may include an upper layer 194F and a lower layer 194S, and an alignment insulating layer 120' may include a first alignment insulating layer 120F and a second alignment insulating layer 120S. An arrangement of contact plugs 195', a vertical power structure 170', and a backside power structure 180' may be identical to those in the embodiment of FIG. 4A.

The upper layer 194F and the lower layer 194S of the second interlayer insulating layer 194' may extend around (e.g., surround) a side surface of a power distribution line 182 and a side surface of a metal structure 185, respectively. The first alignment insulating layer 120F may be disposed on a lower surface of the backside insulating layer 115. The upper layer 194F may be disposed on a lower surface of the first alignment insulating layer 120F. The second alignment insulating layer 120S may be disposed on a lower surface of the upper layer 194F. The lower layer 194S may be disposed on a lower surface of the second alignment insulating layer 120S. The first alignment insulating layer 120F may be a layer for aligning the power distribution line 182, and the second alignment insulating layer 120S may be a layer for aligning the metal structure 185.

Due to a side slope of the power distribution line 182, an opening of the second alignment insulating layer 120S may be larger than an opening of the first alignment insulating layer 120F, but is not limited thereto. The second alignment insulating layer 120S may extend around (e.g., surround) a side surface of an upper region of the metal structure 185 and may be in contact with the metal structure 185. In embodiments, the first alignment insulating layer 120F and the second alignment insulating layer 120S may have the same or different thicknesses, and may include the same or different materials.

Referring to FIG. 5B, unlike the embodiment of FIG. 5A, a semiconductor device 100*g* may further include an etch stop layer 125' including a first etch stop layer 125F on a lower surface of the first alignment insulating layer 120F and a second etch stop layer 125S on a lower surface of the second alignment insulating layer 120S. The first etch stop layer 125F may extend around (e.g., surround) a side surface of a power distribution line 182, and the second etch stop layer 125S may extend (e.g., surround) a side surface of a metal structure 185. In embodiments, the first etch stop layer 125F and the second etch stop layer 125S may have the same or different thicknesses and may include the same or different materials.

Referring to FIG. 5C, unlike the embodiment of FIG. 5A, a semiconductor device 100*h* may not include an alignment insulating layer 120' (see FIG. 5A) and may further include an etch stop layer 125' including a first etch stop layer 125F and a second etch stop layer 125S. A power distribution line 182 may extend through (e.g., pass through) the first etch stop layer 125F, and a metal structure 185 may extend through (e.g., pass through) the second etch stop layer 125S.

FIGS. 6A, 6B, 7A, 7B, 8A, 8B, 9A, 9B, 10A, 10B, and 11 to 15 are cross-sectional views illustrating a process sequence to describe a method of manufacturing a semiconductor device according to example embodiments. FIGS. 6A, 6B, 7A, 7B, 8A, 8B, 9A, 9B, 10A, 10B, and 11 to 15 illustrate an embodiment of a method of manufacturing the semiconductor device of FIGS. 1, 2A, 2B, and 2C. FIGS. 6A, 7A, 8A, 9A, and 10A illustrate cross-sections corresponding to FIG. 2A, and FIGS. 6B, 7B, 8B, 9B, 10B, 11, 12, 13, 14, and 15 illustrate cross-sections corresponding to FIG. 2C.

Figure 6A:
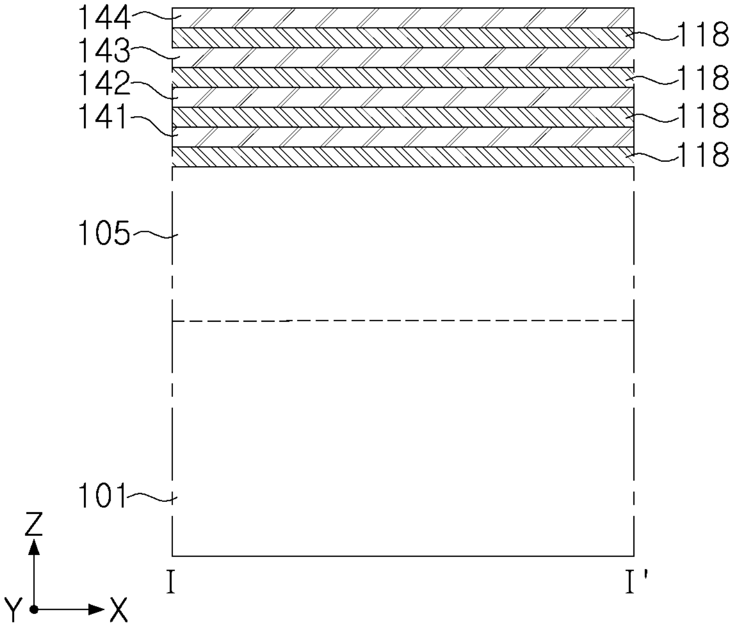
FIGS. 6A, 6B, 7A, 7B, 8A, 8B, 9A, 9B, 10A, 10B, and 11 to 15 are cross-sectional views illustrating a process sequence to describe a method of manufacturing a semiconductor device according to example embodiments.
Figure 6B:
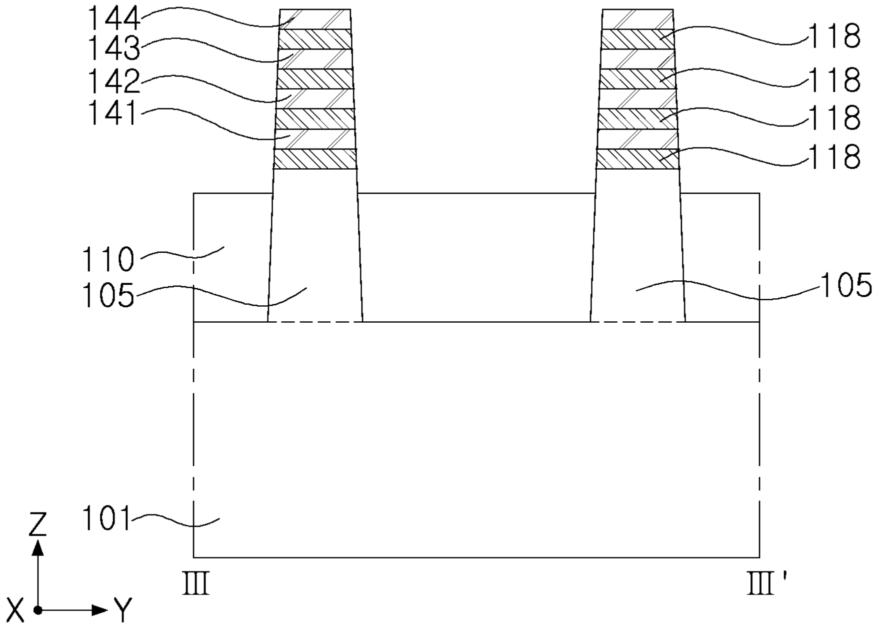

Referring to FIGS. 6A and 6B, sacrificial layers 118 and first to fourth channel layers 141, 142, 143, and 144 may be alternately stacked on a substrate 101, and active structures including active regions 105 may be formed.

The sacrificial layers 118 may be layers to be replaced with gate dielectric layers 162 and a gate electrode 165, below the fourth channel layer 144, by a subsequent process, as illustrated in FIG. 2A. The sacrificial layers 118 may be formed of a material having etch selectivity with respect to the first to fourth channel layers 141, 142, 143, and 144, respectively. The first to fourth channel layers 141, 142, 143, and 144 may include a material, different from materials of the sacrificial layers 118. The sacrificial layers 118 and the first to fourth channel layers 141, 142, 143, and 144 may include, for example, a semiconductor material including silicon (Si), silicon germanium (SiGe), and/or germanium (Ge) but may include different materials and may or may not include impurities. For example, the sacrificial layers 118 may include silicon germanium (SiGe), and the first to fourth channel layers 141, 142, 143, and 144 may include silicon (Si).

The sacrificial layers 118 and the first to fourth channel layers 141, 142, 143, and 144 may be formed on the substrate 101 by performing an epitaxial growth process. The number of layers of the channel layers 141, 142, 143, and 144, alternately stacked with the sacrificial layers 118, may be variously changed in embodiments.

Next, the active structures may be formed by patterning the sacrificial layers 118, the first to fourth channel layers 141, 142, 143, and 144, and an upper region of the substrate 101. The active structures may include the sacrificial layers 118 and the first to fourth channel layers 141, 142, 143, and 144, alternately stacked with each other, and may further include the active regions 105 formed by removing a portion of the substrate 101 to protrude from the substrate 101. The active structures may be formed to have a linear shape extending in one direction, for example, the first direction (e.g., X-direction) and may be formed spaced apart from each other in the second direction (e.g., Y-direction). Depending on an aspect ratio, side surfaces of the active structures may have an inclined shape to increase widths in a downward direction (e.g., toward the substrate 101).

In a region in which a portion of the substrate 101 is removed, a device isolation layer 110 may be formed by burying an insulating material and then partially removing the insulating material such that the active regions 105 protrude. An upper surface of the device isolation layer 110 may be formed on a vertical level, lower than upper surfaces of the active regions 105.

Figure 7A:
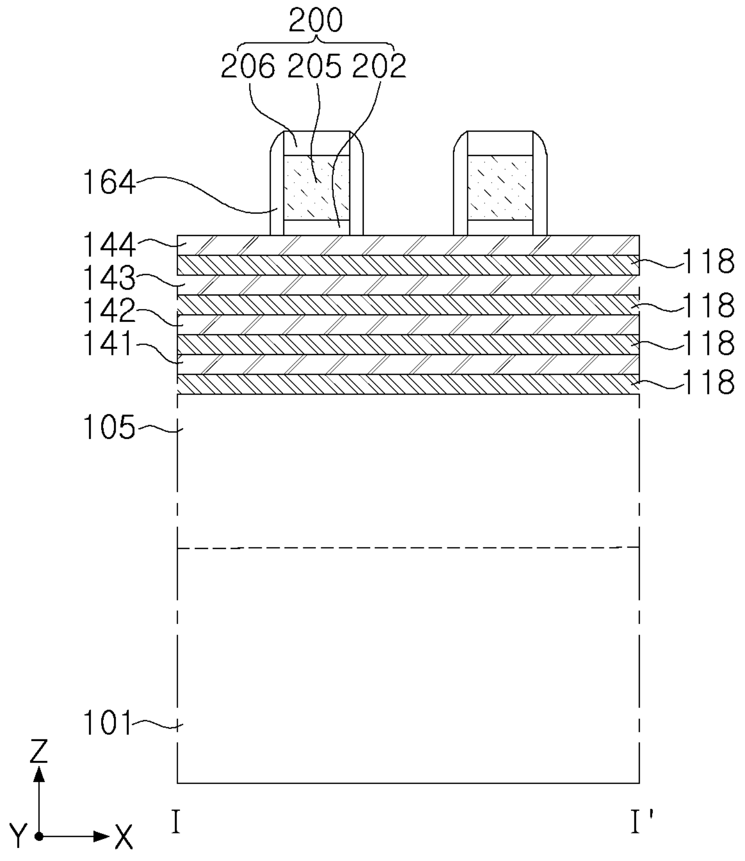
Figure 7B:
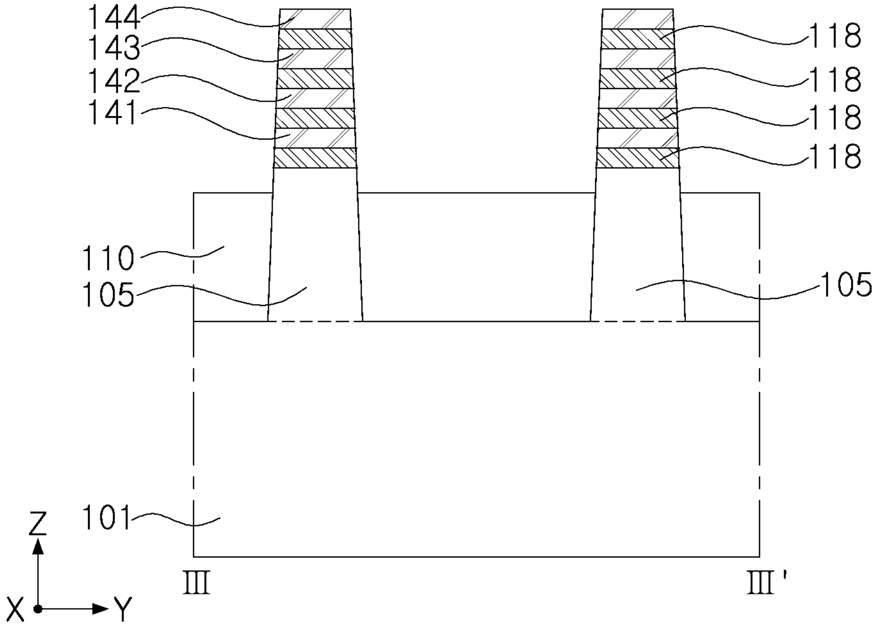

Referring to FIGS. 7A and 7B, sacrificial gate structures 200 and gate spacer layers 164 may be formed on the active structures.

The sacrificial gate structures 200 may be sacrificial structures formed in a region in which a gate dielectric layer 162 and a gate electrode 165 are disposed on channel structures 140 by a subsequent process, as illustrated in FIGS. 2A and 2B. The sacrificial gate structures 200 may have a linear shape extending in one direction, intersecting the active structures. The sacrificial gate structures 200 may extend in the second direction (e.g., Y-direction), and may be disposed to be spaced apart from each other in the first direction (e.g., X-direction).

The sacrificial gate structure 200 may include first and second sacrificial gate layers 202 and 205 and a mask pattern layer 206, sequentially stacked. The first and second sacrificial gate layers 202 and 205 may be patterned using the mask pattern layer 206. The first and second sacrificial gate layers 202 and 205 may be an insulating layer and a conductive layer, respectively, but are not limited thereto, and the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride.

The gate spacer layers 164 may be formed on both sidewalls of the sacrificial gate structures 200. The gate spacer layers 164 may be formed of a low-x material. The gate spacer layers 164 may include, for example, SiO, SiN, SiCN, SiOC, SiON, and/or SiOCN, but is not limited thereto.

Figure 8A:
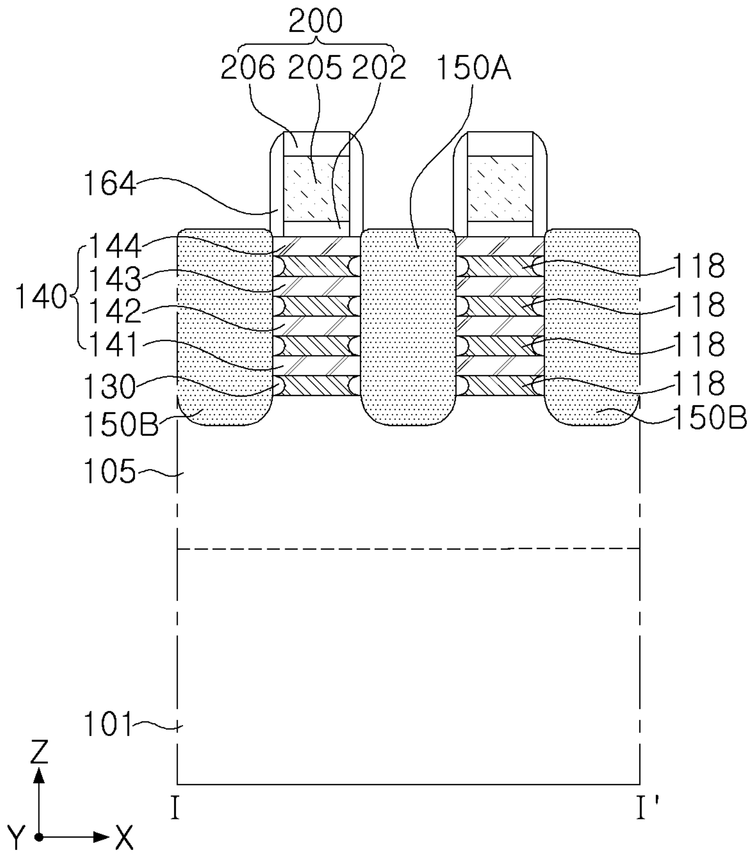
Figure 8B:
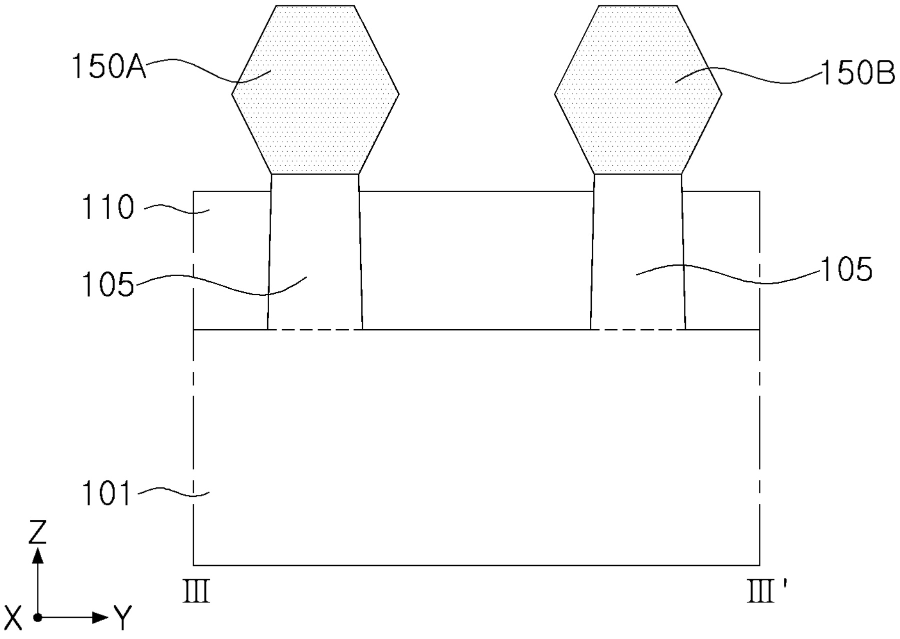

Referring to FIGS. 8A and 8B, sacrificial layers 118 and first to fourth channel layers 141, 142, 143, and 144 may be partially removed between the sacrificial gate structures 200, and internal spacer layers 130 and first and second source/drain regions 150A and 150B may be formed.

First, the exposed sacrificial layers 118 and the exposed first to fourth channel layers 141, 142, 143, and 144 may be partially removed by using the sacrificial gate structures 200 and the gate spacer layers 164 as a mask, to form recessed regions. In this operation, the first to fourth channel layers 141, 142, 143, and 144 may form the channel structures 140 having a limited length in the first direction (e.g., X-direction).

Next, the sacrificial layers 118 exposed through the recessed regions may be partially removed from side surfaces thereof. The sacrificial layers 118 may be selectively etched with respect to the channel structures 140 by, for example, a wet etching process, and may be removed to a predetermined depth from the side surfaces thereof in the first direction (e.g., X-direction). Each of the sacrificial layers 118 may have the side surfaces that may be concave inward due to the side etching, as described above. Shapes of the side surfaces of the sacrificial layers 118 are not limited to those illustrated.

The internal spacer layers 130 may be formed by filling an insulating material in a region in which the sacrificial layers 118 are removed (e.g., inwardly concave side surface areas) and removing the insulating material deposited on an external side surface of the channel structures 140. The internal spacer layers 130 may be formed of the same material as gate spacer layers 164, but are not limited thereto. For example, the internal spacer layers 130 may include SiN, SiCN, SiOCN, SiBCN, and/or SiBN, but are not limited thereto.

The first and second source/drain regions 150A and 150B may be formed by growing from side surfaces of the active regions 105 and the channel structures 140 by, for example, a selective epitaxial process. The first and second source/drain regions 150A and 150B may include impurities (e.g., by in-situ doping). The first and second source/drain regions 150A and 150B may include a plurality of layers having different doping elements and/or different doping concentrations.

Figure 9A:
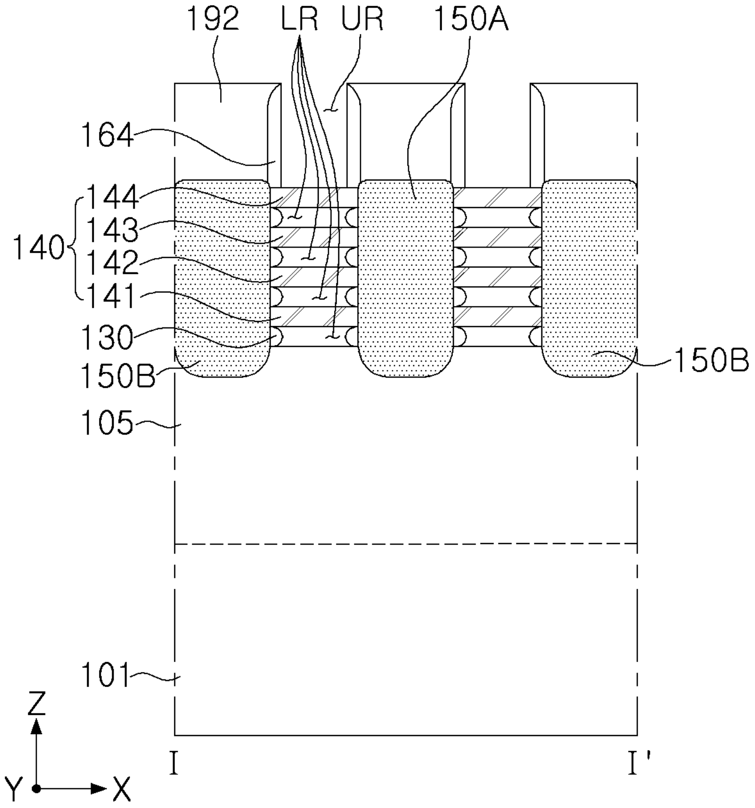
Figure 9B:
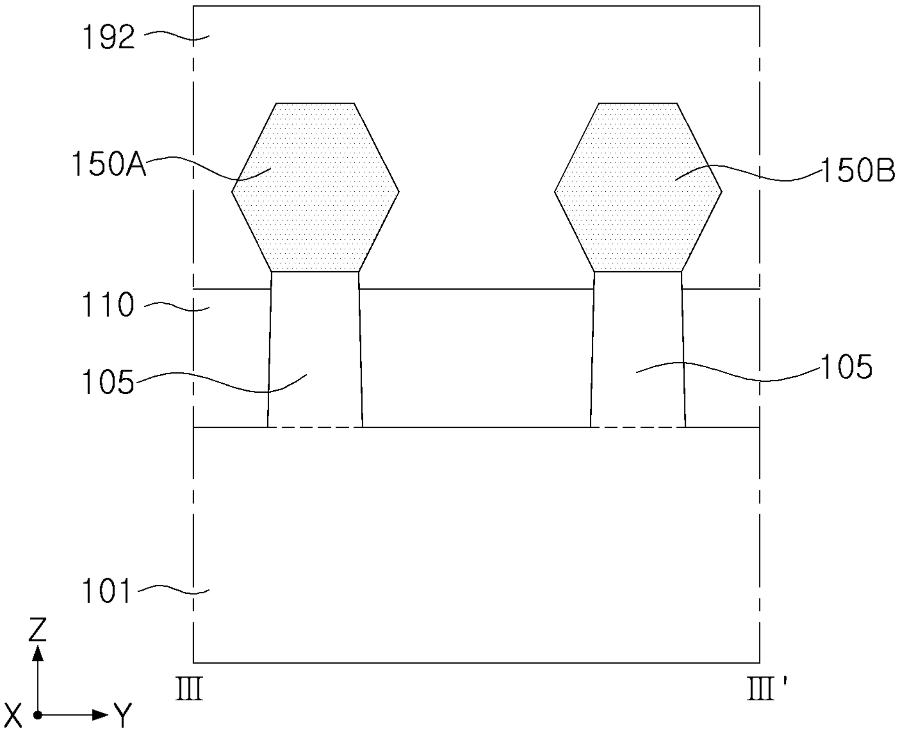

Referring to FIGS. 9A and 9B, a first interlayer insulating layer 192 may be partially formed, and the sacrificial layers 118 and the sacrificial gate structures 200 may be removed.

The first interlayer insulating layer 192 may be formed by forming an insulating film on (e.g., covering) the sacrificial gate structures 200 and the first and second source/drain regions 150A and 150B and performing a planarization process thereon.

The sacrificial layers 118 and the sacrificial gate structures 200 may be selectively removed with respect to the gate spacer layers 164, the first interlayer insulating layer 192, the channel structures 140, and the internal spacer layers 130. First, the sacrificial gate structures 200 may be removed to form upper gap regions UR, and then the sacrificial layers 118 exposed through the upper gap regions UR may be removed to form lower gap regions LR. During the removal process, the first and second source/drain regions 150A and 150B may be protected by the first interlayer insulating layer 192 and the internal spacer layers 130.

Figure 10A:
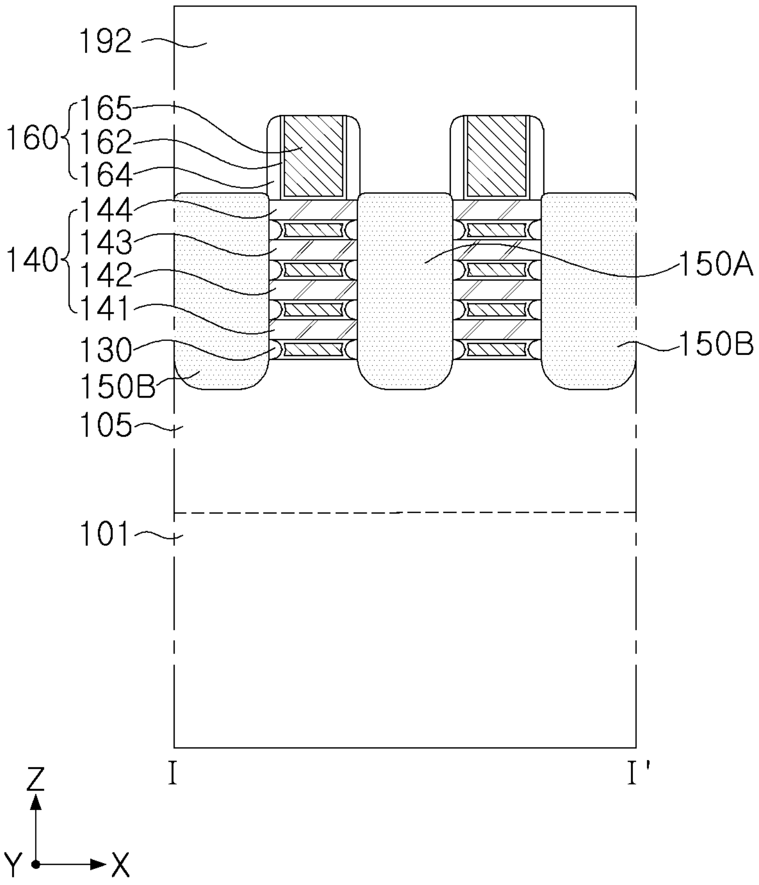
Figure 10B:
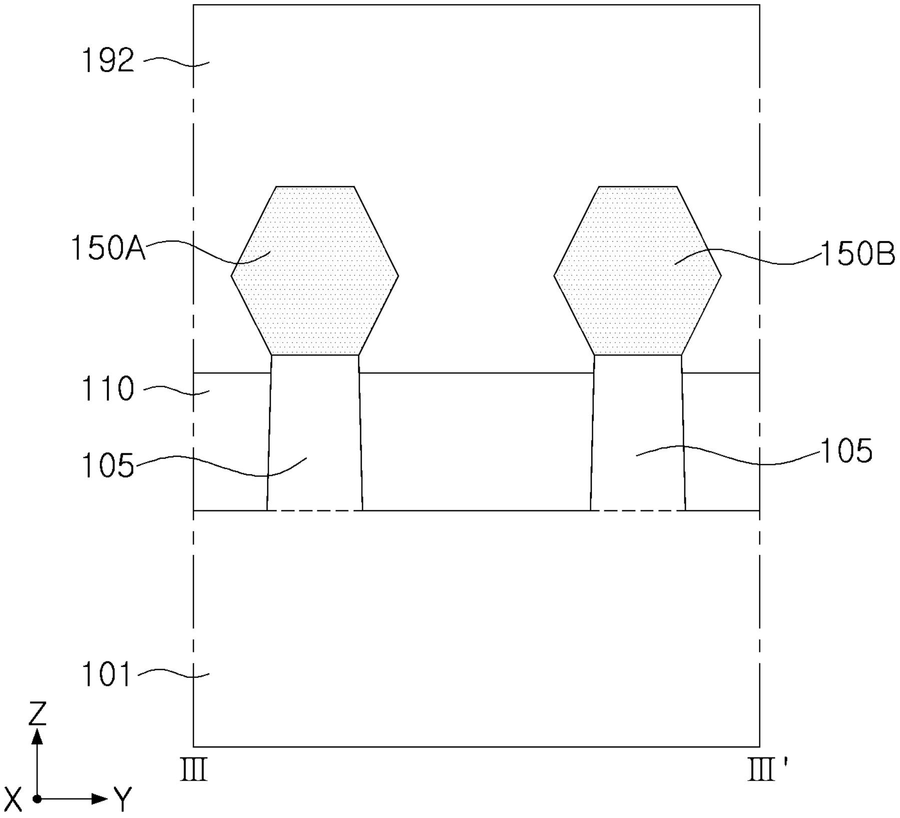

Referring to FIGS. 10A and 10B, gate structures 160 may be formed by forming gate dielectric layers 162 and a gate electrode 165.

The gate dielectric layers 162 and the gate electrode 165 may be formed to fill the upper gap regions UR and the lower gap regions LR. The gate dielectric layers 162 may be formed to conformally cover inner surfaces of the upper gap regions UR and inner surfaces of the lower gap regions LR. After the gate electrode 165 is formed to completely fill the upper gap regions UR and the lower gap regions LR, the upper gap regions UR, together with the gate dielectric layers 162 and the gate spacer layers 164 may be removed by a predetermined depth from the top.

The gate dielectric layers 162, the gate electrode 165, and the gate spacer layers 164 may be formed to continuously extend in the second direction (e.g., Y-direction), and then may be removed in some regions by an etching process. Therefore, the gate structures 160 separated from each other in the second direction (e.g., Y-direction) may be formed. After that, a first interlayer insulating layer 192 may be further formed on the gate structures 160.

Figure 11:
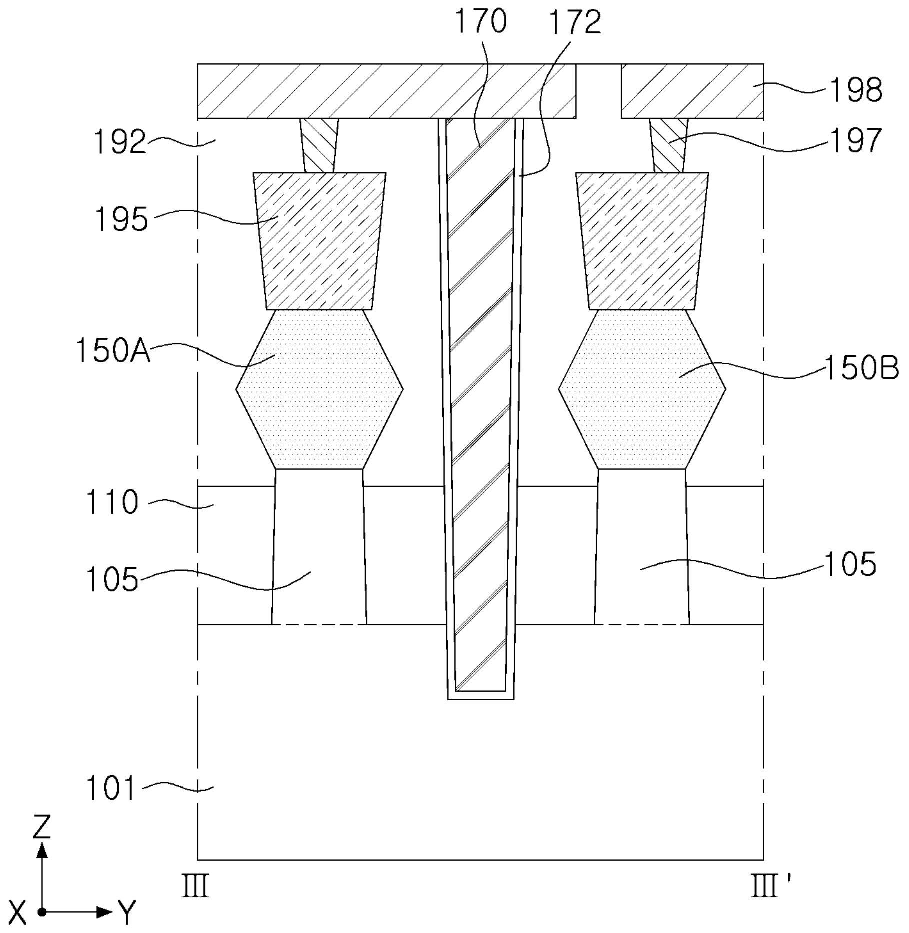

Referring to FIG. 11, contact plugs 195, upper vias 197, a vertical power structure 170, and a vertical insulating layer 172 may be formed, and upper interconnection lines 198 may be then formed.

The contact plugs 195 may be formed by removing a portion of the first interlayer insulating layer 192 and then depositing a conductive material. The upper vias 197 may be formed to be electrically connected (e.g., connected) to the contact plugs 195.

The vertical power structure 170 may be formed in a region between the first source/drain region 150A and the second source/drain region 150B, adjacent to each other, in the second direction (e.g., Y-direction). In the above region, a hole penetrating the first interlayer insulating layer 192 and extending at least partially into the substrate 101 may be formed, an insulating layer and a conductive layer may be sequentially formed in the hole, to form the vertical insulating layer 172 and the vertical power structure 170, respectively. The vertical insulating layer 172 may be formed to conformally cover a bottom surface and inner side surfaces of the hole, and the vertical power structure 170 may be formed to fill the hole.

The upper interconnection lines 198 may be formed to be electrically connected (e.g., connected) to the upper vias 197 and the vertical power structure 170. Among the upper interconnection lines 198, an upper interconnection line 198 electrically connected (e.g., connected) to the vertical power structure 170 may be a power transmission line. In embodiments, in an interconnection structure including the upper vias 197 and the upper interconnection lines 198, the number of layers formed by the vias and the interconnection lines may be variously changed.

The embodiments of FIGS. 4A, 4B, 4C, 5A, 5B, and 5C may be prepared by forming a vertical power structure 170, forming contact plugs 195 to connect a portion thereof to the vertical power structure 170, and forming upper vias 197 and upper interconnection lines 198, during a manufacturing process.

Figure 12:
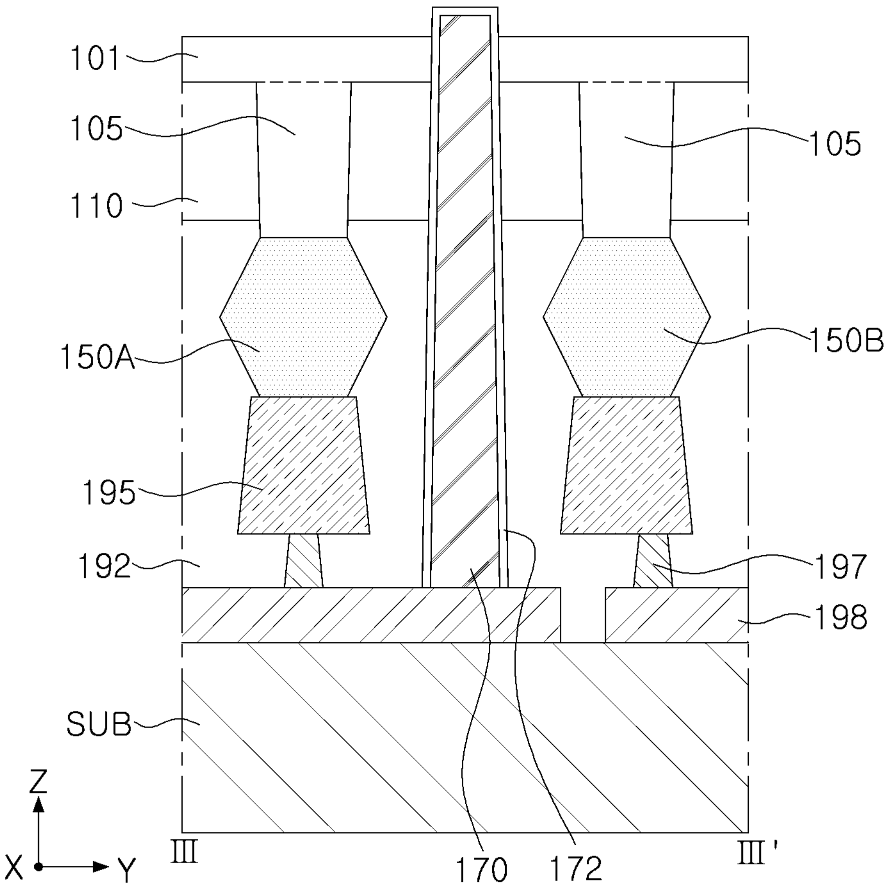

Referring to FIG. 12, the entire structure formed with reference to FIGS. 6A, 6B, 7A, 7B, 8A, 8B, 9A, 9B, 10A, 10B, and 11 may be bonded (e.g., attached) to a carrier substrate SUB, and the substrate 101 may be partially removed.

To perform processes on the lower surface of the substrate 101 illustrated in FIG. 11, the carrier substrate SUB may be bonded (e.g., attached) to the first interlayer insulating layer 192. In the following drawings, for ease of understanding, the entire structure may be illustrated as being rotated or reversed in a mirror image of the structure illustrated in FIG. 11.

The substrate 101 may be partially removed by a predetermined thickness from the upper surface of the substrate 101. The substrate 101 may be removed and thinned by, for example, a lapping process, a grinding process, or a polishing process. A thickness from which the substrate 101 is removed may be changed in various embodiments. In some embodiments, the substrate 101 may be completely removed on the device isolation layer 110. As the substrate 101 is thinned, the vertical power structure 170 and the vertical insulating layer 172 may protrude from the upper surface of the substrate 101. In embodiments, the presence or absence of protrusion and a degree of protrusion of the vertical power structure 170 are not limited to those illustrated.

Figure 13:
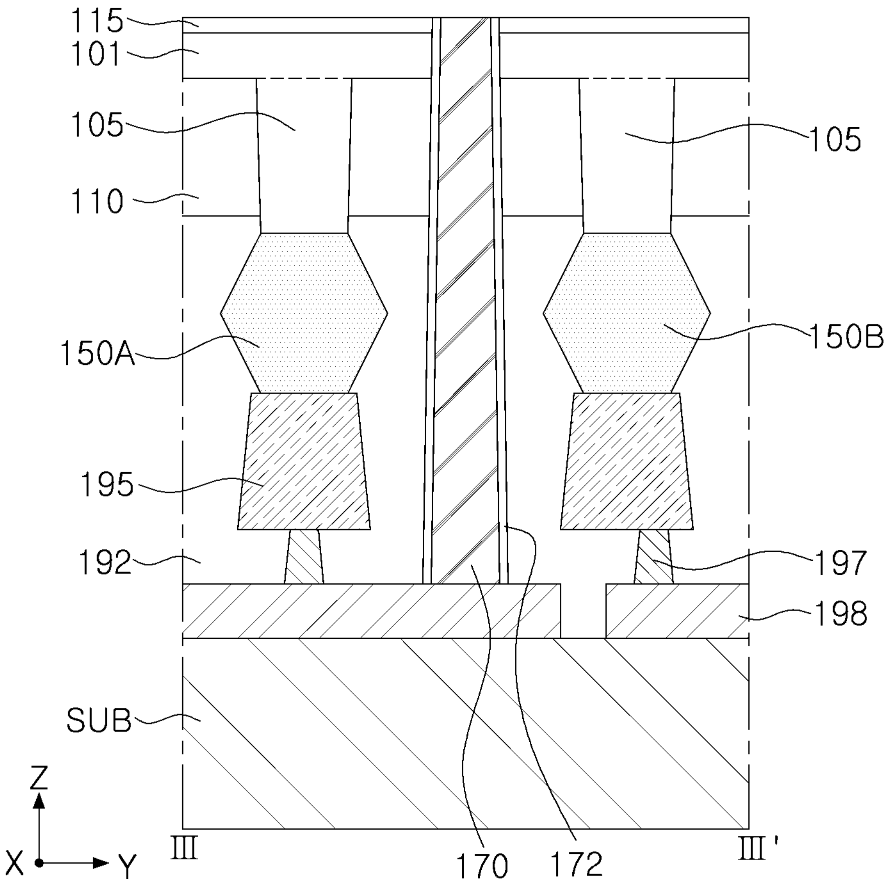

Referring to FIG. 13, an upper surface of the vertical power structure 170 may be exposed, and a backside insulating layer 115 may be formed on the upper surface of the substrate 101.

A portion of the vertical insulating layer 172 on the upper surface of the vertical power structure 170 may be removed to expose the vertical power structure 170. Depending on embodiments, a portion of the vertical power structure 170 may also be removed in this operation.

The backside insulating layer 115 may be formed by a deposition process, or may be formed as an oxidation layer or a native oxide layer of the substrate 101. An upper surface of the backside insulating layer 115 may be coplanar with the upper surface of the vertical power structure 170, but is not limited thereto. For example, in some embodiments, a level of the upper surface of the vertical power structure 170 may be relatively higher than the upper surface of the backside insulating layer 115.

Figure 14:
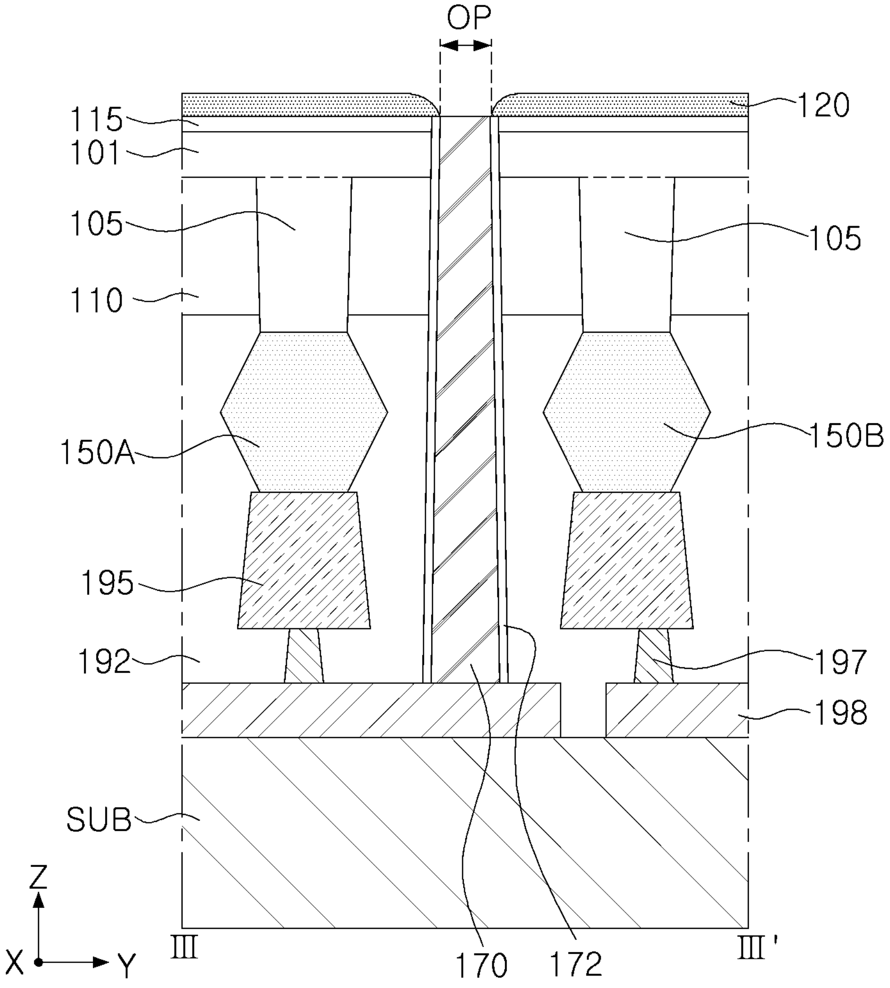

Referring to FIG. 14, an alignment insulating layer 120 may be formed on the backside insulating layer 115. The alignment insulating layer 120 may be formed on the vertical insulating layer 172.

An upper surface of the entire structure may include a metal region including the vertical power structure 170 and a dielectric region including the backside insulating layer 115 and the vertical insulating layer 172. The alignment insulating layer 120 may be selectively deposited on the dielectric region such as the backside insulating layer 115 and the vertical insulating layer 172. Since the alignment insulating layer 120 may be a dielectric layer selectively formed on the dielectric region, the vertical power structure 170 may be exposed without a separate patterning process. Therefore, the alignment insulating layer 120 may not be formed on the vertical power structure 170 to have an opening OP on the vertical power structure 170. The alignment insulating layer 120 may be formed to be relatively thin around the opening OP, such that the upper surface thereof may have a rounded profile.

Figure 15:
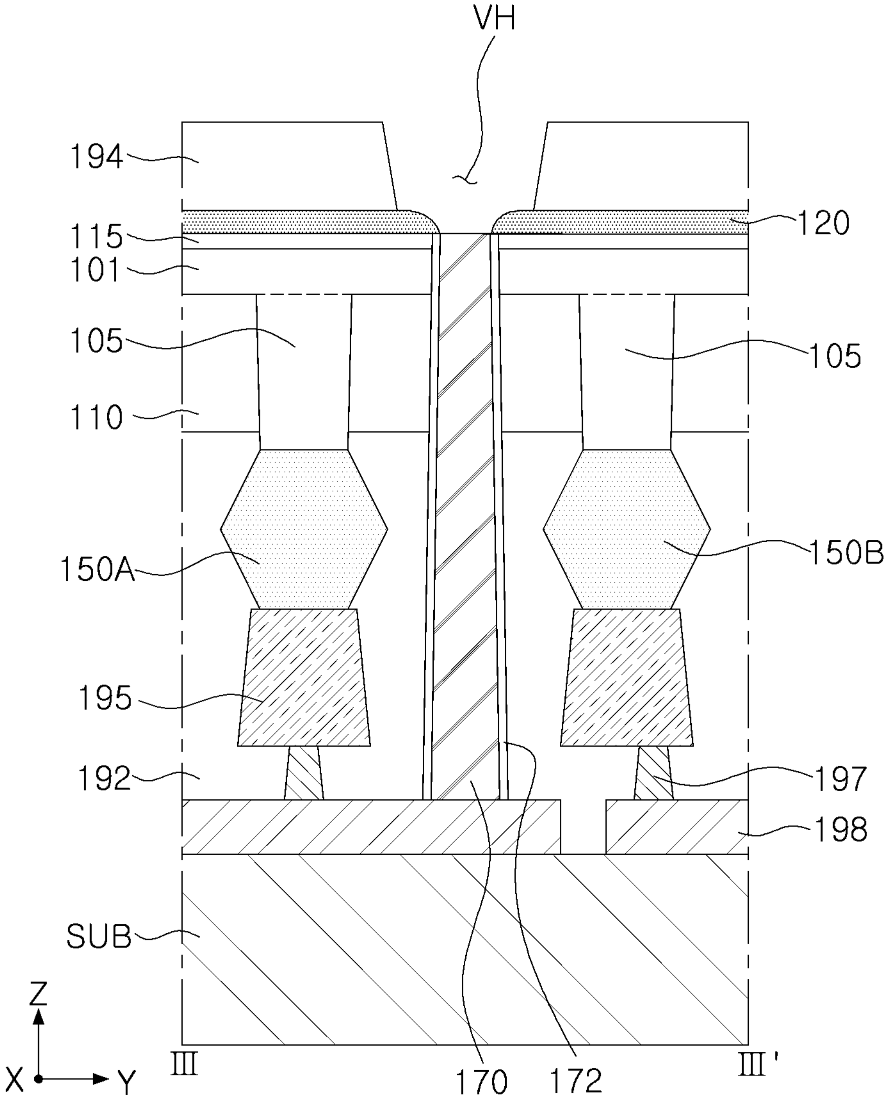

Referring to FIG. 15, a second interlayer insulating layer 194 may be formed and a via trench VH may be formed.

The second interlayer insulating layer 194 may be formed on the alignment insulating layer 120 and may include a material different from a material of the alignment insulating layer 120. In the second interlayer insulating layer 194, the via trench VH may be formed in regions in which a backside power structure 180 (see FIGS. 2B and 2C) to be disposed. A length of the via trench VH extending in the first direction (e.g., X-direction) may be variously changed in embodiments. When the via trench VH is formed, a process of selectively removing the second interlayer insulating layer 194 relative to the alignment insulating layer 120 may be performed. Therefore, the alignment insulating layer 120 may remain without being removed, and an upper surface of the vertical power structure 170 may be exposed.

Next, referring to FIGS. 2A, 2B, and 2C together, a conductive material may be filled in the via trench VH to form the backside power structure 180, and the carrier substrate SUB may be removed.

The backside power structure 180 may be self-aligned to the vertical power structure 170 by the alignment insulating layer 120, and may be thus stably connected to the vertical power structure 170. In some embodiments, even when the via trench VH is misaligned with respect to the vertical power structure 170, the backside power structure 180 may be stably connected to the vertical power structure 170 by the alignment insulating layer 120.

As a result, the semiconductor device 100 of FIGS. 1, 2A, 2B, and 2C may be manufactured. The semiconductor device 100 may be packaged in a state in which the backside power structure 180 is located in an upper portion thereof, but is not limited thereto.

Figure 16A:
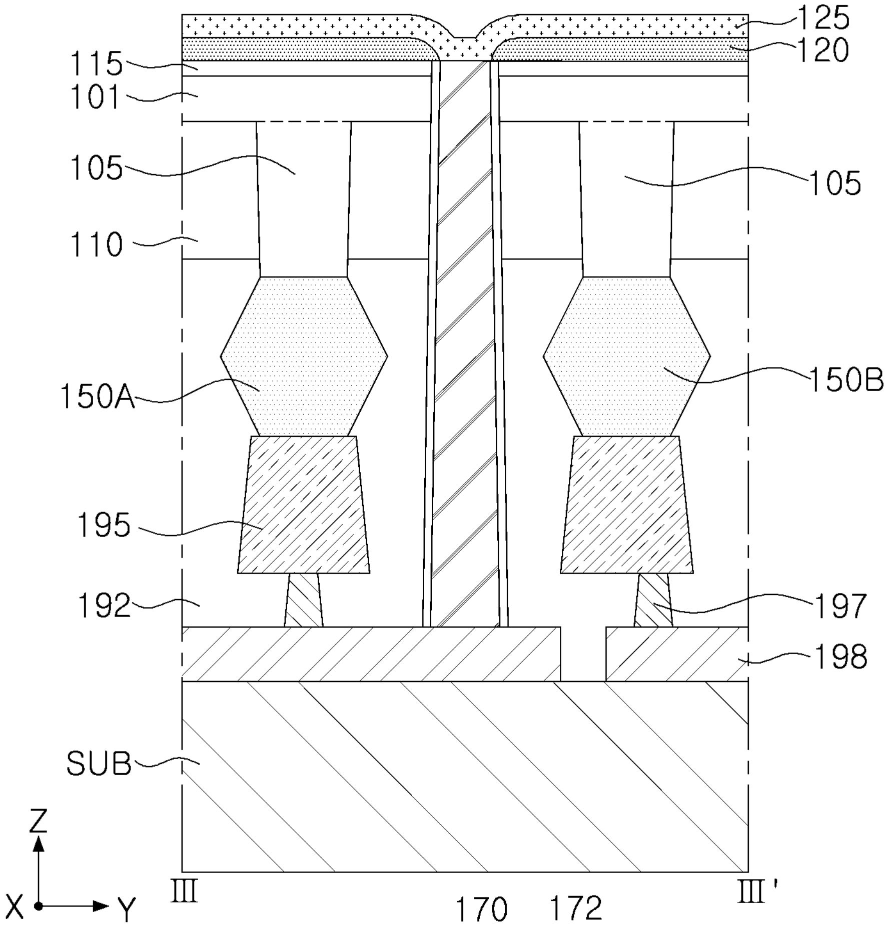
FIGS. 16A and 16B are cross-sectional views illustrating a process sequence to describe a method of manufacturing a semiconductor device according to example embodiments.
Figure 16B:
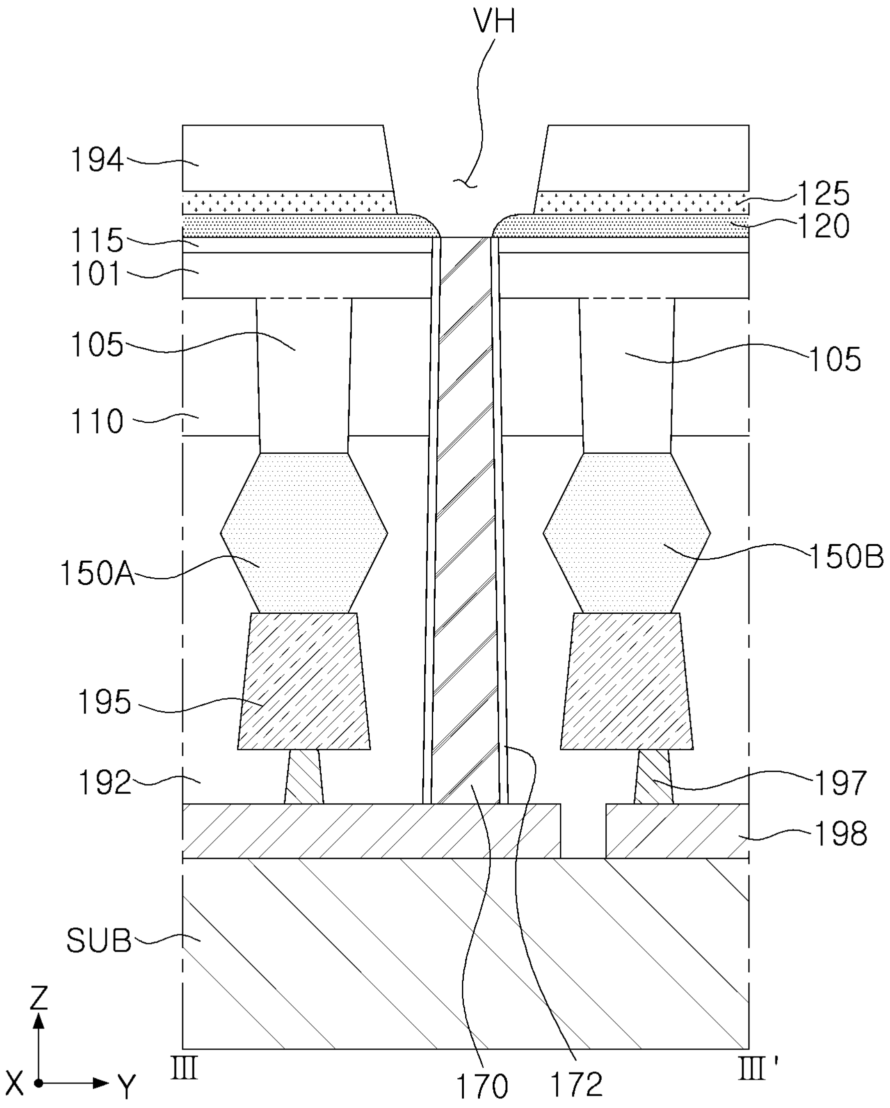

FIGS. 16A and 16B are cross-sectional views illustrating a process sequence to describe a method of manufacturing a semiconductor device according to example embodiments. FIGS. 16A and 16B illustrate an embodiment of a method for manufacturing the semiconductor device of FIG. 3A, and illustrate cross-sections corresponding to FIG. 3A.

Referring to FIG. 16A, after the process described above with reference to FIGS. 6A, 6B, 7A, 7B, 8A, 8B, 9A, 9B, 10A, 10B, and 11 to 14 is performed in the same manner, an etch stop layer 125 may be formed.

The etch stop layer 125 may be formed on the upper surface of the alignment insulating layer 120 and the upper surface of the vertical power structure 170. The etch stop layer 125 may be substantially uniformly formed along a profile of an underlying structure by a deposition process.

Referring to FIG. 16B, a second interlayer insulating layer 194 may be formed, and a via trench VH may be formed.

The second interlayer insulating layer 194 may be formed on the etch stop layer 125 and may include a material different from a material of the etch stop layer 125. In the second interlayer insulating layer 194, the via trench VH may be formed in regions in which a backside power structure 180 (see FIG. 3A) to be disposed. When the via trench VH is formed, the second interlayer insulating layer 194 may be first etched using the etch stop layer 125 as an etch stop layer, and a process of selectively removing the etch stop layer 125 with respect to the alignment insulating layer 120 may be then performed. The second interlayer insulating layer 194 and the etch stop layer 125 may be removed in a continuous process. Therefore, an inner side wall of the via trench VH may extend with a continuous slope in a region defined by the second interlayer insulating layer 194 and the etch stop layer 125. The inner side wall of the via trench VH may have a discontinuous slope and shape in a region defined by the alignment insulating layer 120 with respect to an upper portion (e.g., regions defined by the second interlayer insulating layer 194 and the etch stop layer 125). In this operation, the alignment insulating layer 120 may not be removed, and an upper surface of the vertical power structure 170 may be exposed.

Next, referring to FIG. 3A together, a conductive material may be filled in the via trench VH to form the backside power structure 180, and the carrier substrate SUB may be removed. As a result, the semiconductor device **100*a* of FIG. 3**A may be manufactured.

Figure 17A:
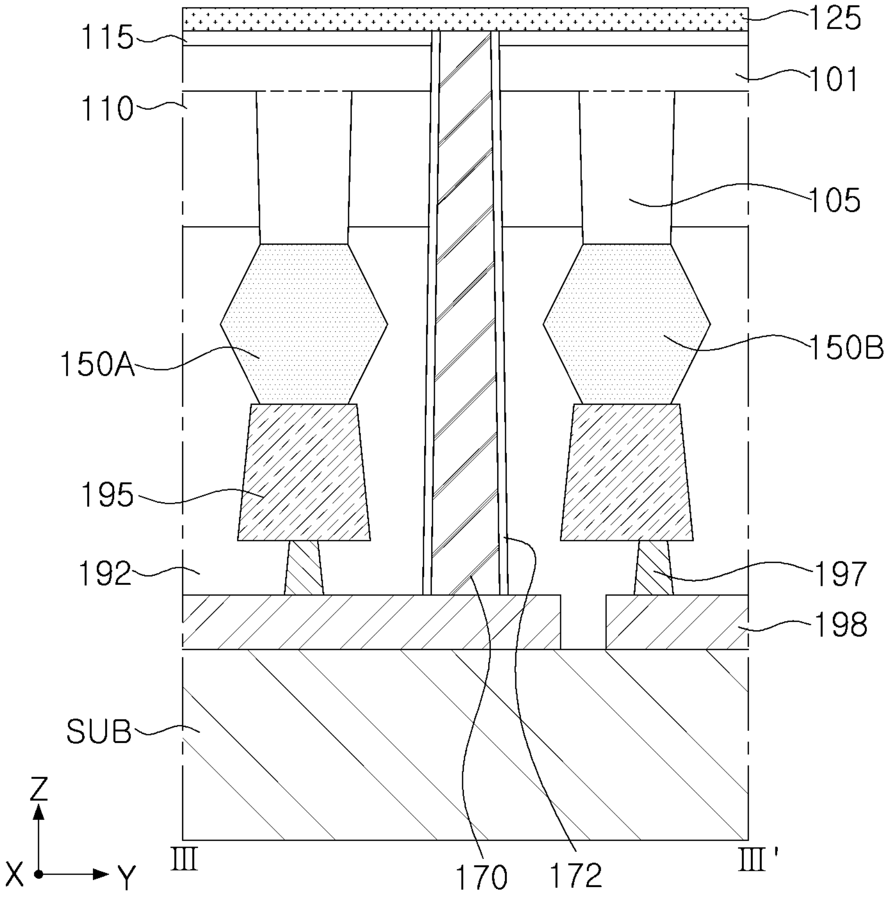
FIGS. 17A and 17B are cross-sectional views illustrating a process sequence to describe a method of manufacturing a semiconductor device according to example embodiments.
Figure 17B:
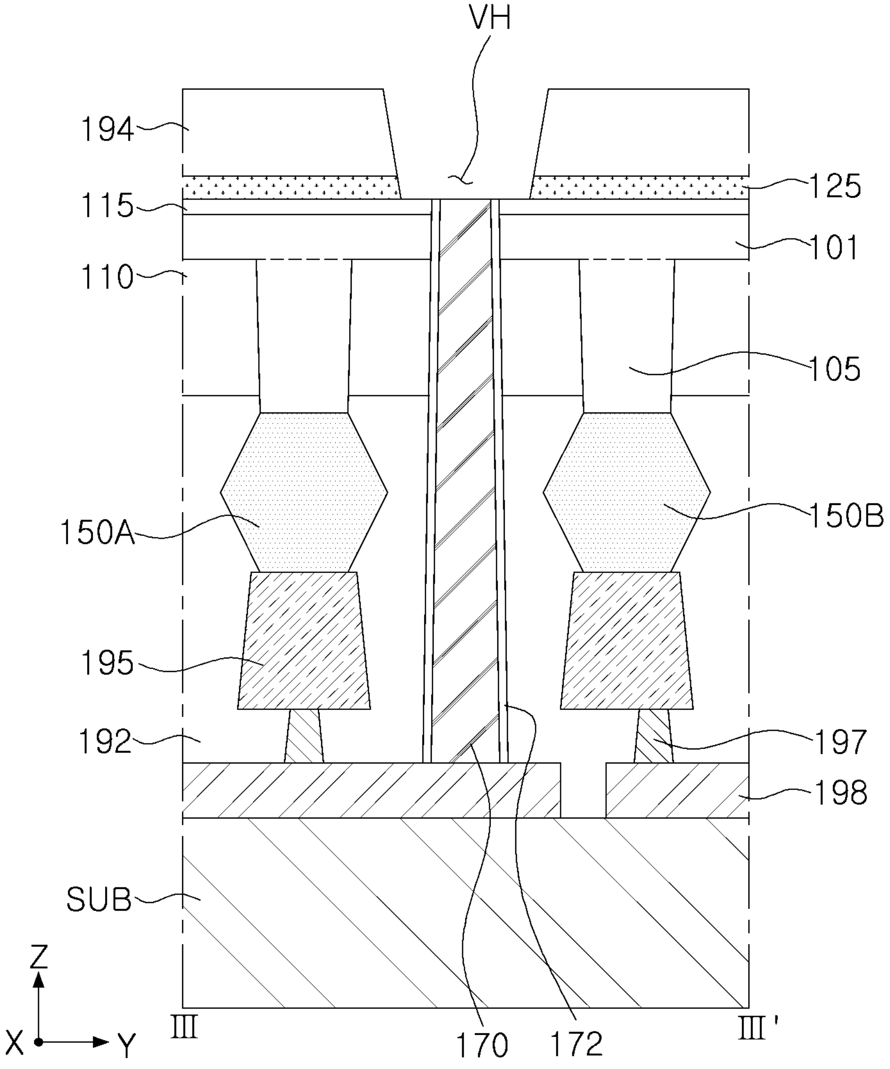

FIGS. 17A and 17B are cross-sectional views illustrating a process sequence to describe a method of manufacturing a semiconductor device according to example embodiments. FIGS. 17A and 17B illustrate an embodiment of a method for manufacturing the semiconductor device of FIG. 3B, and illustrate cross-sections corresponding to FIG. 3B.

Referring to FIG. 17A, after the process described above with reference to FIGS. 6A, 6B, 7A, 7B, 8A, 8B, 9A, 9B, 10A, 10B, and 11 to 13 is performed in the same manner, an etch stop layer 125 may be formed on the backside insulating layer 115.

The etch stop layer 125 may be substantially uniformly formed along a profile of an underlying structure by a deposition process. In this embodiment, for example, the etch stop layer 125 may have a substantially flat upper surface.

Referring to FIG. 17B, a second interlayer insulating layer 194 may be formed, and a via trench VH may be formed.

The second interlayer insulating layer 194 may be formed on the etch stop layer 125 and may include a material different from a material of the etch stop layer 125. In the second interlayer insulating layer 194, the via trench VH may be formed in regions in which a backside power structure 180 (see FIG. 3B) to be disposed. When the via trench VH is formed, the second interlayer insulating layer 194 may be first etched using the etch stop layer 125 as an etch stop layer, and a process of etching the etch stop layer 125 may be then performed. The second interlayer insulating layer 194 and the etch stop layer 125 may be removed in a continuous process. Therefore, an inner side wall of the via trench VH may extend with a continuous slope. As a result, an upper surface of the vertical power structure 170 may be exposed.

Next, referring to FIG. 3B together, a conductive material may be filled in the via trench VH to form the backside power structure 180, and the carrier substrate SUB may be removed. As a result, the semiconductor device **100*b* of FIG. 3**B may be manufactured.

Alignment between a vertical power structure and a backside power structure may be improved using an alignment insulating layer, to provide a semiconductor device having improved reliability.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:

a substrate including an active region that extends in a first direction;

a gate structure extending in a second direction on the active region, wherein the second direction intersects the first direction;

source/drain regions on the active region, wherein the source/drain regions are adjacent the gate structure;

a backside insulating layer on a lower surface of the substrate;

a vertical power structure between adjacent source/drain regions among the source/drain regions in the second direction, wherein the vertical power structure extends through the substrate and the backside insulating layer and has a lower surface exposed from the backside insulating layer;

an interlayer insulating layer on a lower surface of the backside insulating layer;

a backside power structure that extends through the interlayer insulating layer and is connected to the vertical power structure; and a first alignment insulating layer between the lower surface of the backside insulating layer and the interlayer insulating layer, wherein the first alignment insulating layer has a first opening exposing the lower surface of the vertical power structure, and wherein the first alignment insulating layer is in contact with the backside power structure.

2. The semiconductor device of claim 1, wherein an upper region of the backside power structure extends into the first opening.

3. The semiconductor device of claim 1, wherein the first alignment insulating layer has a first thickness in a first region adjacent the vertical power structure and a second thickness in a second region, wherein the second thickness is thicker than the first thickness, and wherein the second region is farther than the first region from the vertical power structure.

4. The semiconductor device of claim 1, wherein the first alignment insulating layer comprises a material that is different from a material of the interlayer insulating layer.

5. The semiconductor device of claim 4, wherein the first alignment insulating layer comprises a material that is different from a material of the backside insulating layer.

6. The semiconductor device of claim 1, wherein the first alignment insulating layer comprises $Al_2O_3$, HfO, $SiO_2$, and/or SiCOH.

7. The semiconductor device of claim 1, wherein the backside insulating layer entirely overlaps the first alignment insulating layer in a third direction, and wherein the third direction is perpendicular to an upper surface of the substrate.

8. The semiconductor device of claim 1, further comprising an etch stop layer on a lower surface of the first alignment insulating layer, wherein the etch stop layer is in contact with the backside power structure.

9. The semiconductor device of claim 8, wherein the first opening of the first alignment insulating layer has a first width, wherein the etch stop layer has a second opening having a second width that is wider than the first width, and wherein the second opening exposes the first opening and a portion of the first alignment insulating layer.

10. The semiconductor device of claim 1, further comprising:

contact plugs connected to the source/drain regions; and interconnection lines that are on the contact plugs and electrically connected to the source/drain regions, wherein the vertical power structure is connected to one of the interconnection lines.

11. The semiconductor device of claim 1, further comprising:

contact plugs connected to the source/drain regions; and interconnection lines that are on the contact plugs and electrically connected to the source/drain regions, wherein the vertical power structure is connected to one of the contact plugs.

12. The semiconductor device of claim 1, wherein the backside power structure further comprises:

a power distribution line that is connected to the vertical power structure; and a metal structure that is connected to the power distribution line.

13. The semiconductor device of claim 12, further comprising:

a second alignment insulating layer on a lower surface of the first alignment insulating layer, wherein the first alignment insulating layer is in contact with the power distribution line, and wherein the second alignment insulating layer is in contact with the metal structure.

14. The semiconductor device of claim 1, further comprising a plurality of channel layers on the active region, wherein the plurality of channel layers are spaced apart from each other in a third direction that is perpendicular to an upper surface of the substrate.

15. A semiconductor device comprising:

a substrate including an active region that extends in a first direction;

a gate structure extending on the substrate in a second direction, wherein the second direction intersects the first direction;

source/drain regions on the active region, wherein the source/drain regions are adjacent the gate structure;

a vertical power structure extending through the substrate in a third direction that is perpendicular to an upper surface of the substrate, wherein the vertical power structure is electrically connected to at least a portion of the source/drain regions;

a backside insulating layer on a lower surface of the substrate, wherein the backside insulating layer is in a periphery of the vertical power structure;

an alignment insulating layer on a lower surface of the backside insulating layer, wherein the alignment insulating layer has an opening that exposes a lower surface of the vertical power structure; and a backside power structure that fills the opening and is connected to the vertical power structure, wherein the alignment insulating layer has a first thickness in a first region adjacent to the vertical power structure and a second thickness in a second region, wherein the second thickness is thicker than the first thickness, and wherein the second region is farther than the first region from the vertical power structure.

16. The semiconductor device of claim 15, wherein a portion of a side surface of the backside power structure has a profile that is curved along the alignment insulating layer adjacent the opening.

17. The semiconductor device of claim 15, wherein the backside power structure has a first width in the opening and a second width that is wider than the first width below the opening.

18. The semiconductor device of claim 15, further comprising a vertical insulating layer on a side surface of the vertical power structure, wherein the alignment insulating layer is on a lower surface of the vertical insulating layer.

19. A semiconductor device comprising:

a substrate including an active region that extends in a first direction;

a gate structure extending on the substrate in a second direction, wherein the second direction intersects the first direction;

source/drain regions on the active region, wherein the source/drain regions are adjacent the gate structure;

a vertical power structure extending through the substrate in a third direction that is perpendicular to an upper surface of the substrate, wherein the vertical power structure is electrically connected to at least a portion of the source/drain regions;

an alignment insulating layer on a lower surface of the substrate, wherein the alignment insulating layer has an opening that exposes a lower surface of the vertical power structure; and a backside power structure that fills the opening of the alignment insulating layer and is connected to the vertical power structure, wherein an upper surface of the vertical power structure is located on a level in the third direction, equal to or higher than levels of upper surfaces of the source/drain regions in the third direction relative to the substrate, and wherein a level of the lower surface of the vertical power structure in the third direction is lower than a level of the lower surface of the substrate in the third direction relative to the substrate.

20. The semiconductor device of claim 19, further comprising a backside insulating layer between the lower surface of the substrate and the alignment insulating layer, wherein the backside insulating layer is in a periphery of the vertical power structure, and wherein the backside insulating layer entirely overlaps the alignment insulating layer in the third direction.

* * * * *